United States Patent
Costa et al.

(10) Patent No.: US 9,460,799 B1
(45) Date of Patent: Oct. 4, 2016

(54) RECOVERY OF PARTIALLY PROGRAMMED BLOCK IN NON-VOLATILE MEMORY

(71) Applicant: SanDisk Technologies Inc., Plano, TX (US)

(72) Inventors: Xiying Costa, San Jose, CA (US); Dana Lee, Saratoga, CA (US); Zhenming Zhou, San Jose, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/951,347

(22) Filed: Nov. 24, 2015

(51) Int. Cl.
   *G11C 11/34* (2006.01)
   *G11C 16/16* (2006.01)
   *G11C 16/28* (2006.01)

(52) U.S. Cl.
   CPC ............. *G11C 16/16* (2013.01); *G11C 16/28* (2013.01)

(58) Field of Classification Search
   None
   See application file for complete search history.

(56) References Cited

U.S. PATENT DOCUMENTS

| | | | |
|---|---|---|---|
| 8,743,615 B2 | 6/2014 | Lee et al. | |
| 8,787,088 B2 | 7/2014 | Dutta et al. | |
| 8,947,958 B2 * | 2/2015 | Mu | G11C 16/344 365/185.29 |
| 8,964,480 B2 | 2/2015 | Mui et al. | |
| 2008/0316816 A1 | 12/2008 | Lin | |
| 2011/0182121 A1 * | 7/2011 | Dutta | G11C 11/5628 365/185.09 |
| 2013/0250688 A1 * | 9/2013 | Chen | G11C 11/5628 365/185.17 |
| 2015/0268871 A1 | 9/2015 | Shu et al. | |

* cited by examiner

*Primary Examiner* — Khamdan Alrobaie
*Assistant Examiner* — Sultana Begum
(74) *Attorney, Agent, or Firm* — Vierra Magen Marcus LLP

(57) ABSTRACT

Techniques for recovery of partially programmed blocks in non-volatile storage are disclosed. After programming memory cells in an open region of a partially programmed block, a fail bit count with respect to programming the memory cells is performed. If the fail bit count is above a threshold, then a recovery operation is performed of other memory cells in the partially programmed block. The recovery operation (such as erase) may remove charges that are trapped in the tunnel dielectric of memory cells in the open region of the partially programmed block. Note that this erase operation may be performed on memory cells in the open region that are already erased. The erase operation may remove trapped charges from the tunnel dielectric. In a sense, this "resets" the memory cells. Thus, the memory cells can now be programmed more effectively. Both programming and date retention may be improved.

20 Claims, 18 Drawing Sheets

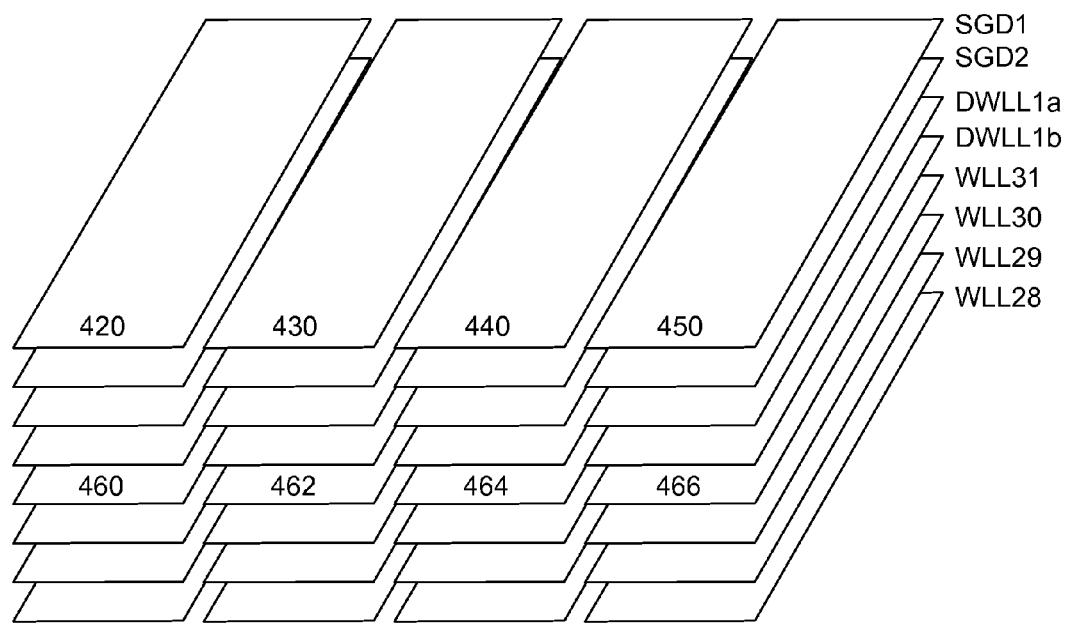
Figure 4C
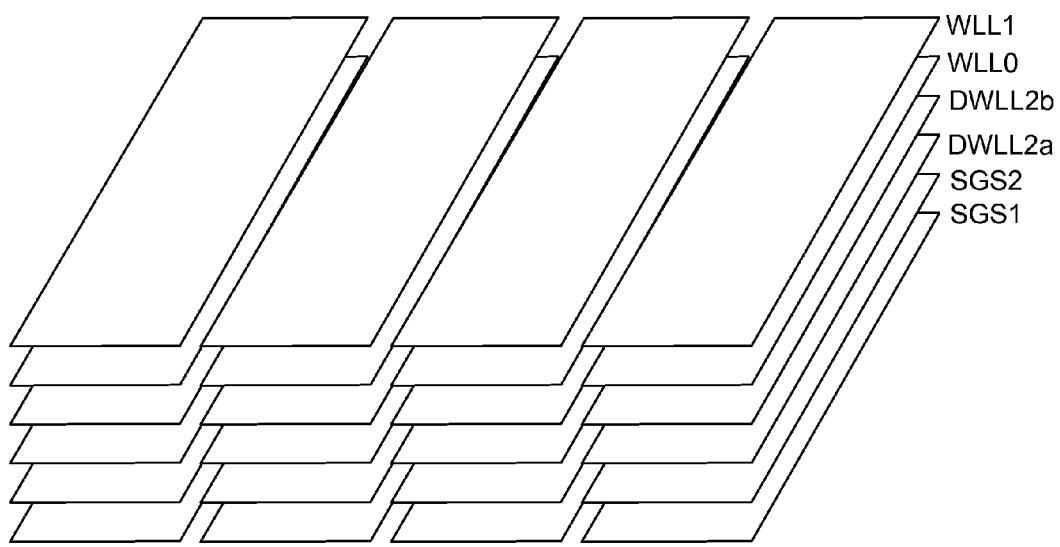

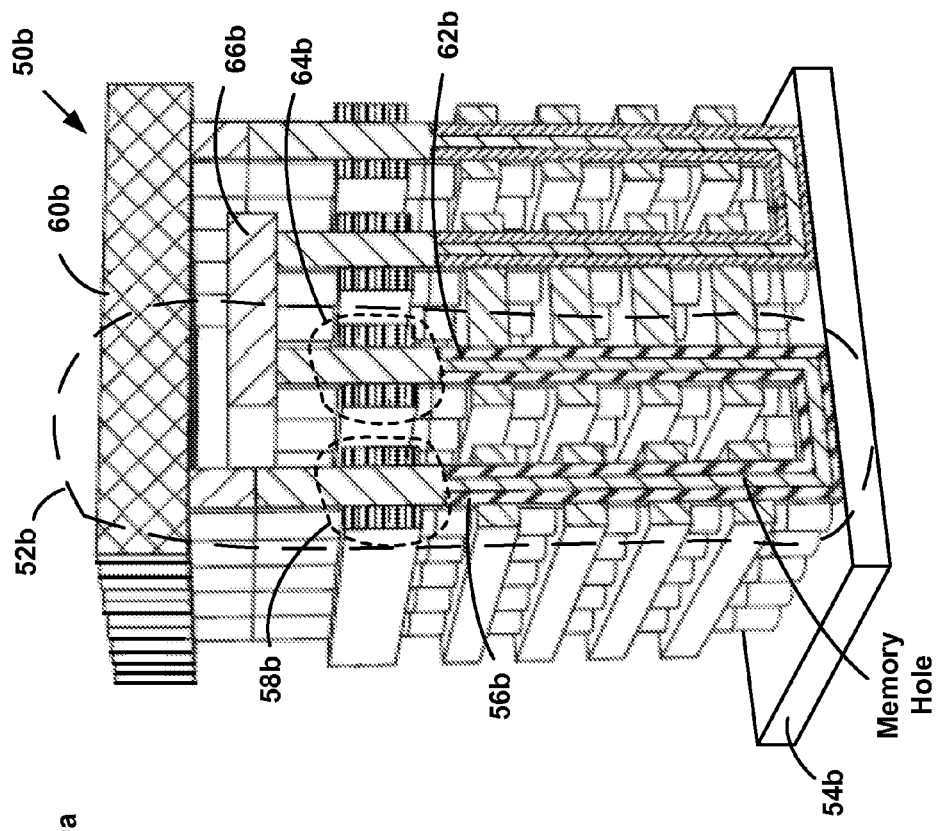
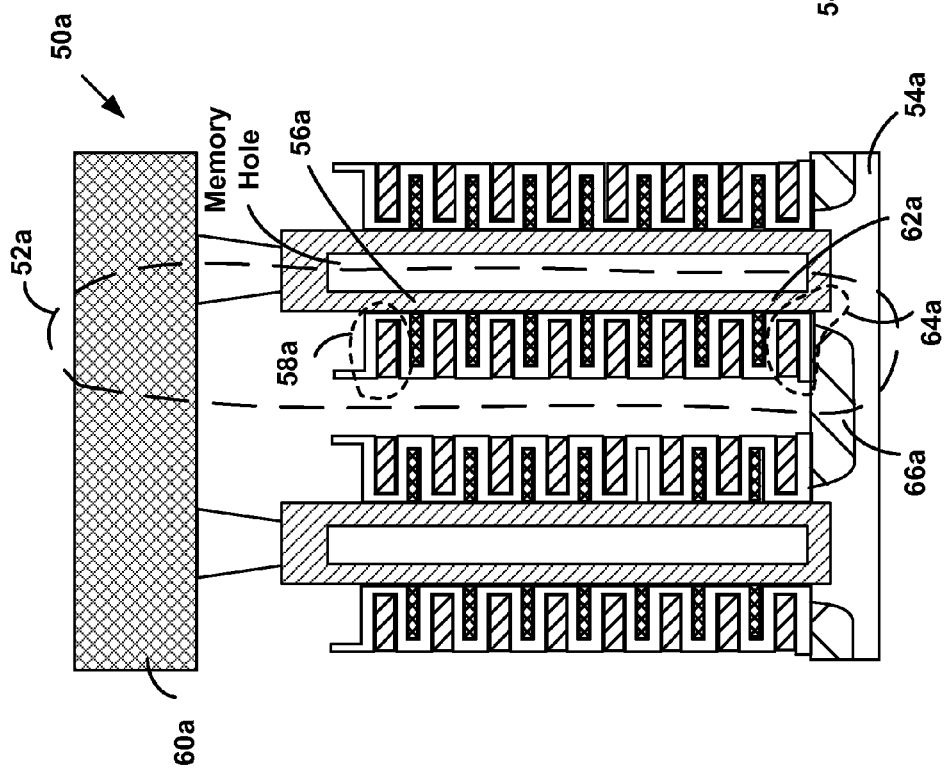
FIG. 5A
FIG. 5B

RECOVERY OF PARTIALLY PROGRAMMED BLOCK IN NON-VOLATILE MEMORY

BACKGROUND

The present disclosure is directed to non-volatile memory technology.

Semiconductor memory is widely used in various electronic devices such as cellular telephones, digital cameras, personal digital assistants, medical electronics, mobile computing devices, and non-mobile computing devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM).

Some non-volatile storage elements have a charge storage region for storing information. One example is a dielectric charge-trapping material that stores a charge which represents a data state. Another example is a conductive floating gate that stores a charge which represents a data state. The non-volatile storage element may take the form a transistor with a control gate. A blocking layer of dielectric material may reside between the charge storage region and the control gate. The non-volatile storage element may have a tunnel dielectric between the charge storage region and channel region. Typically, a program voltage VPGM is applied to the control gate during a program operation to change the amount of charge in the charge storage region, which impacts the threshold voltage ($V_T$) of the non-volatile storage element. Each data state can be represented by a unique range in the threshold voltage ($V_T$). In this manner one, two, or more bits of information may be stored per non-volatile storage element.

Once a non-volatile storage element has been programmed, it is important that its programming state can be read back with a high degree of reliability. However, the sensed programming state can sometimes vary from the intended programming state due to factors such as program disturb and data retention issues. Program disturb refers to the unintentional change to the $V_T$ of a non-volatile storage element while programming another non-volatile storage element. Also, the $V_T$ of the memory cell can drop over time due to charge leakage, which is referred to as a data retention issue. As one example, charge in the charge storage region could leak to the control gate over time, dropping the $V_T$ of the memory cell.

Consequently, it is common to encounter erroneous or corrupted data bits at the time of reading non-volatile memory. Typically, some form of error correction control (ECC) is applied to correct erroneous or corrupted data. Despite these considerations, there remains a need for improved read, erase, and program operations in non-volatile memory.

BRIEF DESCRIPTION OF THE DRAWINGS

FIG. 4C depicts a view of the select gate layers and word line layers.

FIGS. 5A and 5B are cross-sectional and perspective views of a three-dimensional NAND memory array.

DETAILED DESCRIPTION

A non-volatile memory system is described herein that uses an improved technique to program partially programmed memory blocks. A partially programmed memory block refers to a group of memory cells that are erased together, and then only a region of the block is programmed leaving a region the block erased after completion of a program request. For example, after a programming request is complete, memory cells in some region of the block are still in the erased state. Note that memory cells in a partially programmed block may sit in the erased state for a significant amount of time. For example, first all of the memory cells in the block are erased. Then, the erased memory cells in some region of the block are programmed in response to a program request, leaving memory cells in another region of the block still erased after the program request is complete. As one example, memory cells associated with one or more word lines are programmed to satisfy the program request, leaving memory cells associated with other word lines still erased. The region of the block that contains the still erased (or unprogrammed) memory cells may be referred to as an "open region" of the block. A block that contains an open region may be referred to as a "partially programmed block." It is possible for considerable time to pass before data is written to the open region of the partially programmed block. Over time, changes may occur to the unprogrammed memory cells (e.g., the erased memory cells) in the open region of the block that can detrimentally impact operating the partially programmed block.

As one example of the changes over time, charges could become trapped in the tunnel dielectric region of the erased memory cells in the open region of the partially programmed block. These charges can impair programming. For example, the fail bit count when programming the memory cells in the open region may increase. The trapped charges can also negatively impact data retention of memory cells in the open region after they have been programmed. Thus, by stating that memory cells remain in the erased state for a "significant amount of time," it is meant that the memory cells remain erased long enough for there to be some measurable negative impact to accurately programming or reading the memory cells.

Figure 1A:
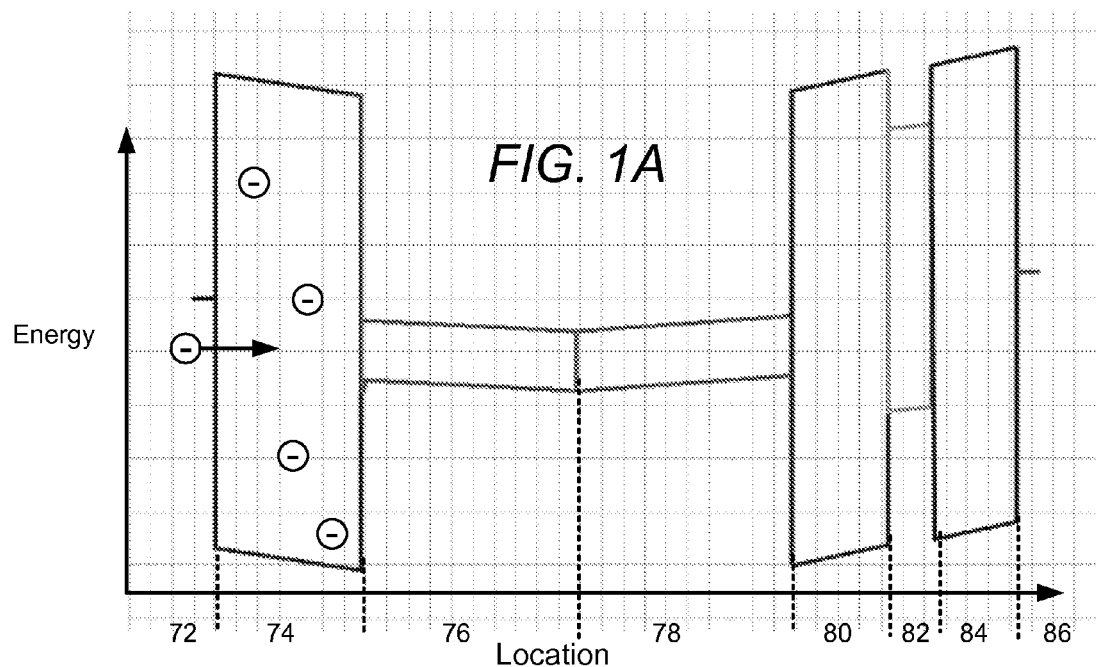
FIGS. 1A and 1B depict energy band diagrams of memory cells to help explain the charge trapping in the tunnel dielectric region.
Figure 1B:
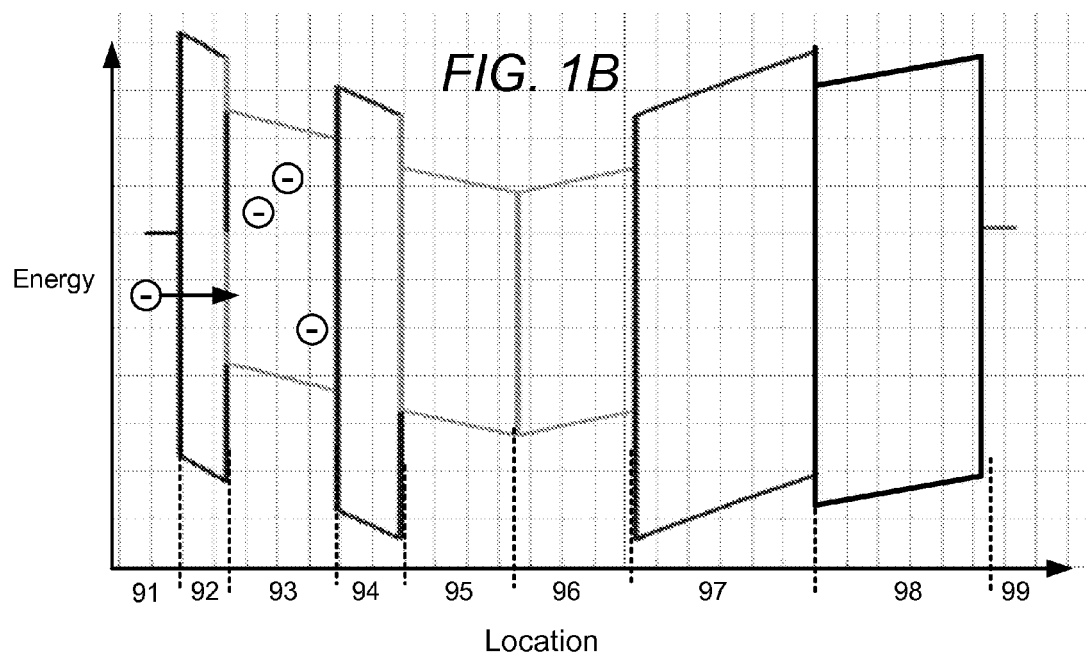

FIGS. 1A and 1B depict energy band diagrams of memory cells to help explain the charge trapping in the tunnel dielectric region. FIG. 1A is for a 2D memory cell. FIG. 1B is for a 3D memory cell. The 2D memory cell has a channel region 72, tunnel dielectric region 74, first floating gate region 76, second floating gate region 78, first blocking layer 80, second blocking layer 82, third blocking layer 84, and control gate 86. The channel region 72 may be silicon. The tunnel dielectric region 74 may be silicon oxide. The first floating gate region 76 may be heavily doped polysilicon. The second floating gate region 78 may also be heavily doped polysilicon. The first blocking layer 80 may be silicon oxide. The second blocking layer 82 may be silicon nitride. The third blocking layer 84 may be silicon oxide. The control gate 86 may be a metal, such as tungsten.

The 3D memory cell in FIG. 1B has a channel region 91, first tunnel dielectric region 92, second tunnel dielectric region 93, third tunnel dielectric region 94, first charge storage region 95, second charge storage region 96, first blocking layer 97, second blocking layer 98, and control gate 99. The channel region 91 may be silicon. The first tunnel dielectric region 92 may be silicon oxide. The second tunnel dielectric region 93 may be silicon nitride. The third tunnel dielectric region 94 may be silicon oxide. The first charge storage region 95 may be silicon nitride. The second charge storage region 96 may be silicon nitride. The first blocking layer 97 may be silicon oxide. The second blocking layer 98 may be silicon oxide. The control gate 99 may be a metal, such as tungsten.

First consider the situation in which the memory cells are erased. For both the 2D and 3D examples, electrons from the channel (72 or 91) may be attracted to a tunnel dielectric region due to, for example, electrostatic potential. The trapped charges in the tunnel dielectric region can raise the threshold voltage of the memory cell. This can make the erase tail of the erase distribution worse. For example, the upper tail of the erase distribution can shift towards the $V_T$ of the lowest programmed state.

The foregoing problems can be worse for 3D memory cells. Some 3D memory cells have a higher neutral $V_T$ than some 2D memory cells. The foregoing problems can be worse for a memory cell having a higher neutral $V_T$. For example, a higher neutral $V_T$ may make it easier for electrons to tunnel from the channel into the tunnel dielectric.

Also, some 3D memory cells have a cylindrical shape. The cylindrical shape results in a cylindrical electrical field. The foregoing problems can be worse for memory cells having a cylindrical electrical field. For example, a cylindrical electrical field for the 3D case in FIG. 1B may make it easier for electrons to tunnel into the tunnel dielectric.

Next, consider the situation in which the memory cells are programmed. Data retention may also be negatively impacted if electrons are trapped in the tunnel dielectric region. Programming the 2D memory cell may involve storing electrons in the floating gate regions 76, 78, which raises the $V_T$. Note that these additional electrons in the floating gate 76, 78 may affect the electrons trapped in the dielectric region 74. If some of the electrons trapped in the dielectric region 74 were to leak back to the channel 72, this could lower the $V_T$, resulting in a data retention issue.

Programming the 3D memory cell may involve storing electrons in the charge storage regions 95, 96, which raises the $V_T$. Note that these additional electrons in the charge storage regions 95, 96 may affect the electrons trapped in the dielectric regions 92, 93, and/or 94. If some of the electrons trapped in the dielectric regions 92, 93, and/or 94 were to leak back to the channel 91, this could lower the $V_T$, resulting in a data retention issue.

In one embodiment, after programming memory cells in an open region of a partially programmed block, a fail bit count with respect to programming the memory cells is performed. If the fail bit count is above a threshold, then a recovery operation is performed with respect to other memory cells in the partially programmed block. The recovery operation may alleviate the condition that caused the high fail bit count. For example, the recovery operation may remove charges that are trapped in the tunnel dielectric of memory cells in the open region of the partially programmed block.

One example of a recovery operation is to perform an erase operation. Note that this erase operation may be performed on memory cells in the open region that are already erased. The erase operation may remove trapped charges from the tunnel dielectric. In a sense, this "resets" the memory cells. Thus, the memory cells can now be programmed more effectively. Also, data retention issues may be resolved.

In some embodiments, techniques disclosed herein are applied in a 3D stacked non-volatile memory device. The following is one example of a 3D stacked non-volatile memory device. Embodiments disclosed herein are not limited to this 3D example. Embodiments disclosed herein are not limited to 3D memory. For example, techniques disclosed herein may also be used in 2D memory, such as but not limited to, 2D NAND. Embodiments are not limited to NAND. For example, other types of memory cells including, but not limited to NOR, have tunnel dielectrics in which charges may become trapped while the memory cell is erased.

Figure 2A:
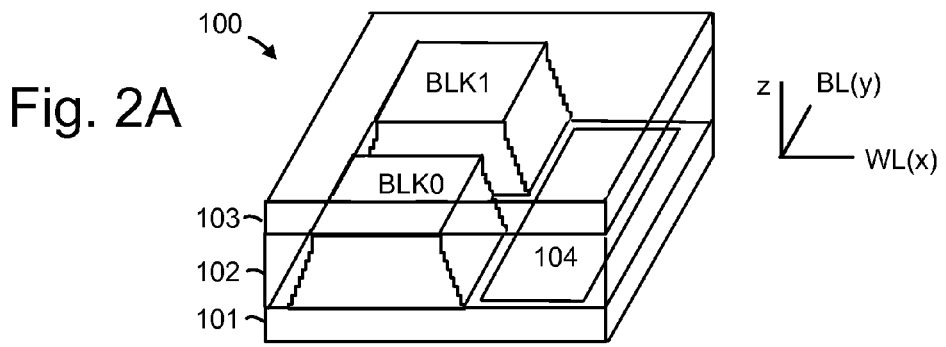
FIG. 2A is a perspective view of a 3D stacked non-volatile memory device.

FIG. 2A is a perspective view of a three dimensional (3D) stacked non-volatile memory device. The memory device 100 includes a substrate 101. On and above the substrate are example blocks BLK0 and BLK1 of memory cells (non-volatile storage elements). Also on substrate 101 is peripheral area 104 with support circuits for use by the blocks. Substrate 101 can also carry circuits under the blocks, along with one or more lower metal layers which are patterned in conductive paths to carry signals of the circuits. The blocks are formed in an intermediate region 102 of the memory device. In an upper region 103 of the memory device, one or more upper metal layers are patterned in conductive paths to carry signals of the circuits. Each block comprises a stacked area of memory cells, where alternating levels of the stack represent word lines. While two blocks are depicted as an example, additional blocks can be used, extending in the x- and/or y-directions.

In one example implementation, the length of the plane in the x-direction, represents a direction in which signal paths for word lines extend (a word line or SGD line direction), and the width of the plane in the y-direction, represents a direction in which signal paths for bit lines extend (a bit line direction). The z-direction represents a height of the memory device.

Figure 2B:
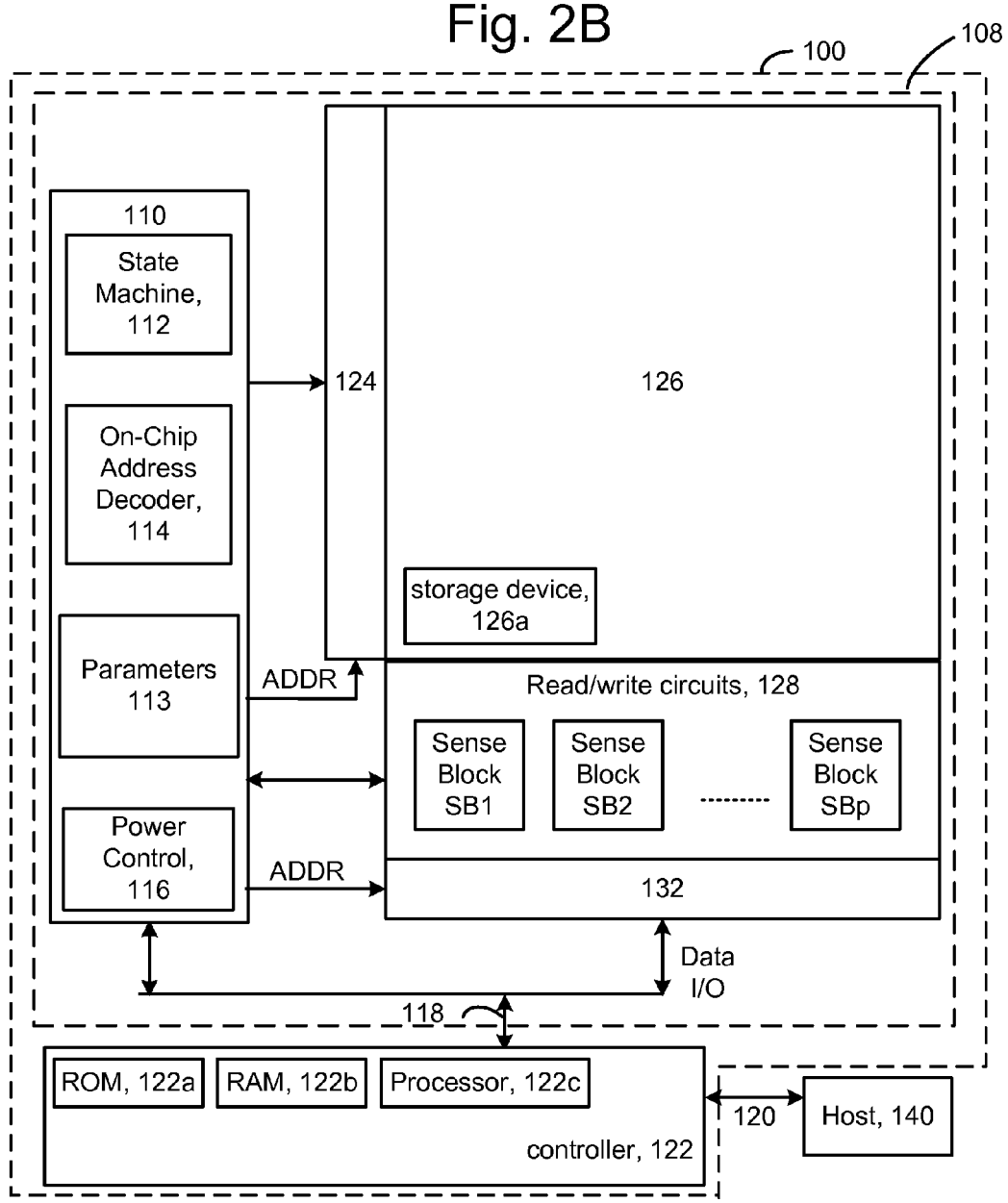
FIG. 2B is a functional block diagram of a memory device such as the 3D stacked non-volatile memory device of FIG. 2A.

FIG. 2B is a functional block diagram of an example memory device such as the 3D stacked non-volatile memory device 100 of FIG. 2A. Memory device 100 includes one or more memory die 108. Each memory die 108 includes a three-dimensional memory structure 126 of memory cells (such as, for example, a 3D array of memory cells), control circuitry 110, and read/write circuits 128. The memory structure 126 is addressable by word lines via a row decoder 124 and by bit lines via a column decoder 132. The read/write circuits 128 include multiple sense blocks SB1, SB2, . . . , SBp (sensing circuitry) and allow a page of memory cells to be read or programmed in parallel. In some systems, a controller 122 is included in the same memory device 100 (e.g., a removable storage card) as the one or more memory die 108. However, in other systems, the controller is in a different memory device 100 from the memory die 108. In some embodiments, one controller 122 will communicate with multiple memory die 108. In other embodiments, each memory die 108 has its own controller. Commands and data are transferred between the host 140 and controller 122 via a data bus 120, and between controller 122 and the one or more memory die 108 via lines 118. In one embodiment, memory die 108 includes a set of input and/or output (I/O) pins that connect to lines 118.

Memory structure 126 may comprise one or more arrays of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

As a non-limiting example, a three dimensional memory structure may be vertically arranged as a stack of multiple two dimensional memory device levels. For example, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

As another non-limiting example, a three dimensional memory array may be arranged as multiple vertical columns (e.g., columns extending substantially perpendicular to the major surface of the substrate, i.e., in the y direction) with each column having multiple memory elements. The columns may be arranged in a two dimensional configuration, e.g., in an x-y plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Thus, in one embodiment, the non-volatile storage elements are arranged as a vertically oriented NAND strings. Other three dimensional configurations can be envisioned wherein some NAND strings contain memory elements in a single memory level while other strings contain memory elements which span through multiple memory levels.

Three dimensional memory arrays may also be designed in a NOR configuration, in a ReRAM configuration, a ferroelectric random access memory ("FRAM"), and magnetoresistive random access memory ("MRAM"), as well as other semiconductor elements capable of storing information. The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Control circuitry 110 cooperates with the read/write circuits 128 to perform memory operations (e.g., erase, program, read, and others) on memory structure 126, and includes a state machine 112, an on-chip address decoder 114, and a power control module 116. The state machine 112 provides chip-level control of memory operations. Code and parameter storage 113 may be provided for storing operational parameters and software. In one embodiment, state machine 112 is programmable by the software stored in code and parameter storage 113. In other embodiments, state machine 112 does not use software and is completely implemented in hardware (e.g., electronic circuits).

The on-chip address decoder 114 provides an address interface between addresses used by host 140 or memory controller 122 to the hardware address (ADDR) used by the decoders 124 and 132. Power control module 116 controls the power and voltages supplied to the word lines and bit lines during memory operations. It can include drivers for word line layers (discussed below) in a 3D configuration, select transistors (e.g., SGS and SGD transistors, described below) and source lines. Power control module 116 may include charge pumps for creating voltages. The sense blocks include bit line drivers. An SGS transistor is a select gate transistor at a source end of a NAND string, and an SGD transistor is a select gate transistor at a drain end of a NAND string.

Any one or any combination of control circuitry 110, state machine 112, decoders 114/124/132, storage 113, power control module 116, sense blocks SB1, SB2, . . . , SBp, read/write circuits 128, and controller 122 can be considered a managing circuit that performs the functions described herein.

The (on-chip or off-chip) controller 122 may comprise a processor 122c and storage devices (memory) such as ROM 122a and RAM 122b. The storage devices comprises code such as a set of instructions, and the processor 122c is operable to execute the set of instructions to provide the functionality described herein. Alternatively or additionally, processor 122c can access code from a storage device in the memory structure, such as a reserved area of memory cells connected to one or more word lines.

A person of ordinary skill in the art will recognize that this technology is not limited to a single specific memory structure, but covers many relevant memory structures within the spirit and scope of the technology as described herein and as understood by one of ordinary skill in the art.

Figure 2C:
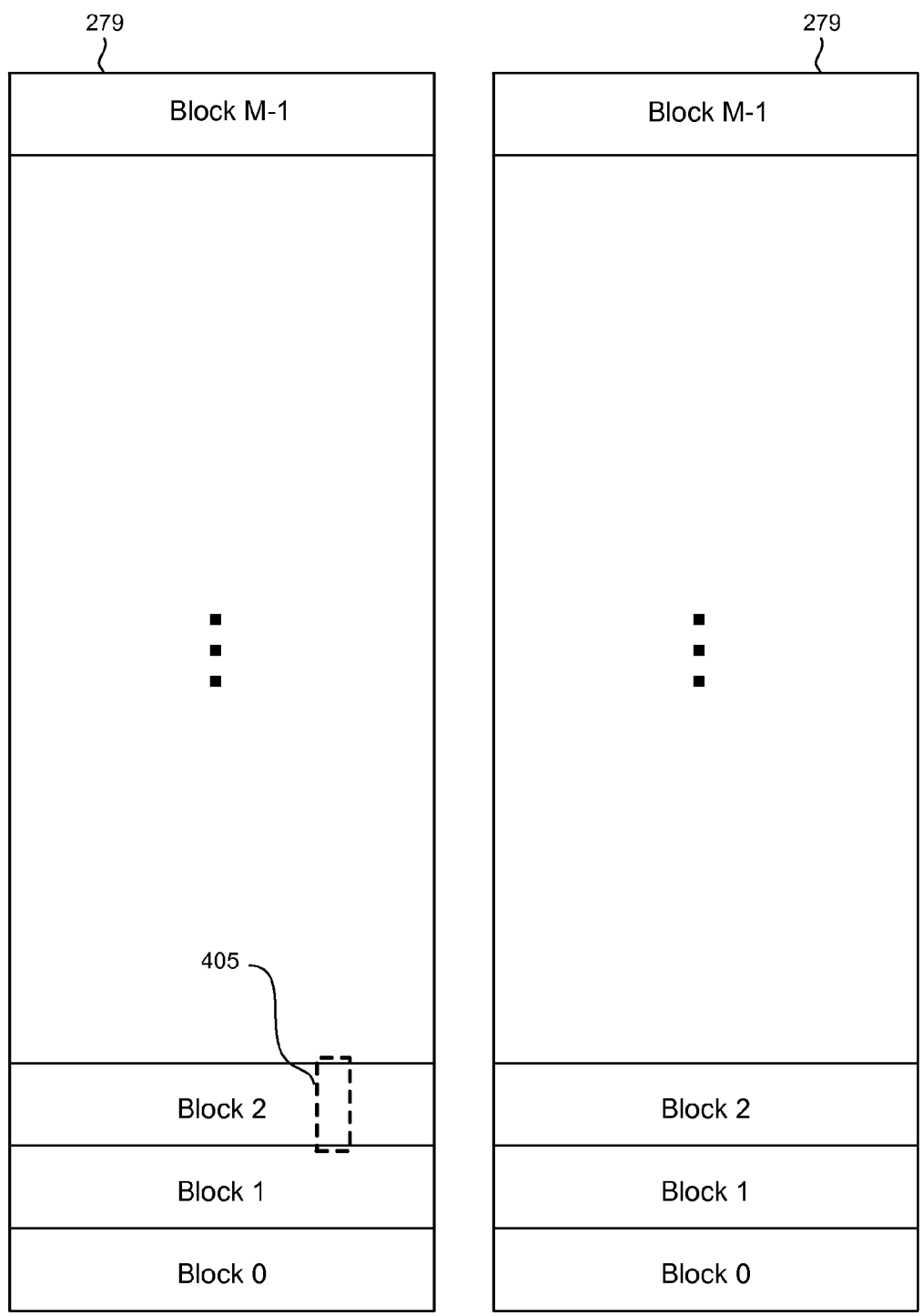
FIG. 2C is a block diagram of a memory structure having two planes.

FIG. 2C is a block diagram explaining one example organization of memory structure 126, which is divided into two planes 279. Each plane is then divided into M blocks. In one example, each plane has about 2000 blocks. However, different numbers of blocks and planes can also be used.

Figure 3A:
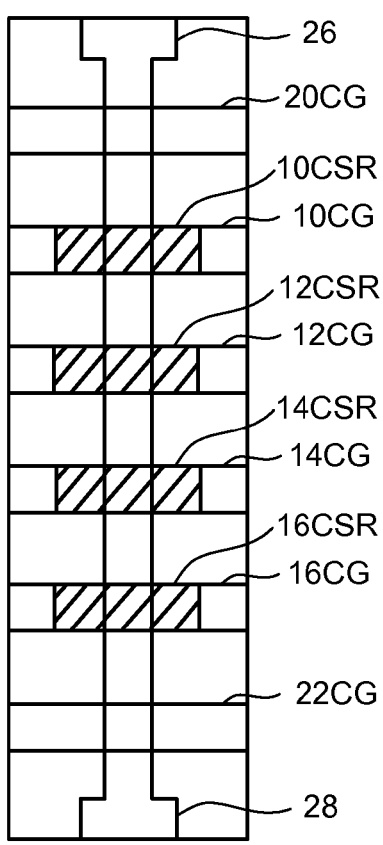
FIG. 3A is a diagram of a NAND string.
Figure 3B:
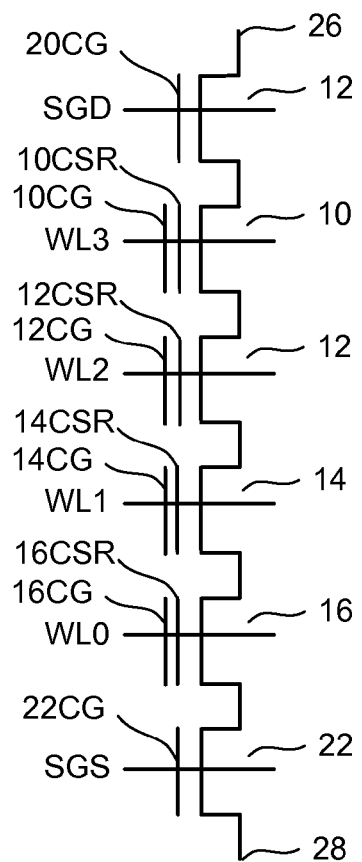
FIG. 3B is an equivalent circuit diagram of the NAND string of FIG. 3A.

One example of a flash memory system uses the NAND structure, which includes multiple transistors arranged in series between two select gates. The transistors in series and the select gates are referred to as a NAND string. FIG. 3A is a top view showing one NAND string 301. FIG. 3B is an equivalent circuit thereof. The NAND string depicted in FIGS. 3A and 3B includes four transistors 10, 12, 14 and 16 in series between a first select gate 12 and a second select gate 22. Select gate 12 connects the NAND string to bit line 26. Select gate 22 connects the NAND string to source line 28. Select gate 12 is controlled by applying appropriate voltages to control gate 20CG via selection line SGD. Select gate 22 is controlled by applying the appropriate voltages to control gate 22CG via selection line SGS. Each of the transistors 10, 12, 14 and 16 includes a control gate and a charge storage region, forming the gate elements of a memory cell. In one embodiment, the charge storage regions are conductive floating gates. In one embodiment, the charge storage regions are dielectric charge storage regions. For example, transistor 10 includes control gate 10CG and charge storage region 10CSR. Transistor 12 includes control gate 12CG and a charge storage region 12CSR. Transistor 14 includes control gate 14CG and charge storage region 14CSR. Transistor 16 includes a control gate 16CG and a charge storage region 16CSR. Control gate 10CG is connected to word line WL3, control gate 12CG is connected to word line WL2, control gate 14CG is connected to word line WL1, and control gate 16CG is connected to word line WL0.

In one embodiment, the charge storage regions (CSR) can be a charge trapping material including a dielectric charge trapping material, which can be, for example, silicon nitride. Alternatively, the charge storage regions (CSR) can include a conductive material such as doped polysilicon or a metallic material that is patterned into multiple electrically isolated portions (e.g., floating gates).

Note that although FIGS. 3A and 3B show four memory cells in the NAND string, the use of four transistors is only provided as an example. A NAND string can have fewer than four memory cells or more than four memory cells. For example, some NAND strings will include eight memory cells, 16 memory cells, 32 memory cells, etc. The discussion herein is not limited to any particular number of memory cells in a NAND string. Other types of non-volatile memory in addition to NAND flash memory can also be used in accordance with embodiments.

Figure 3C:
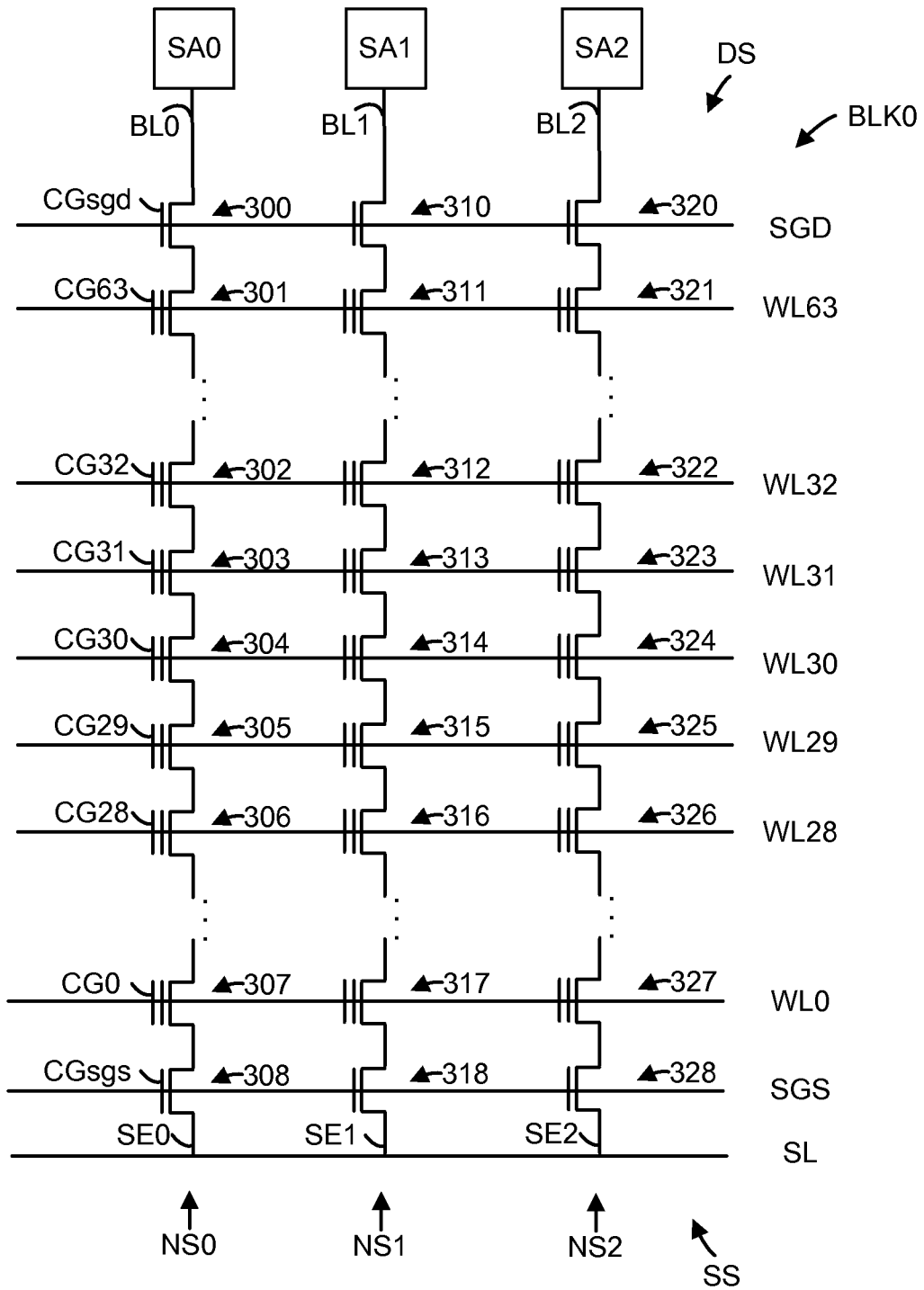
FIG. 3C is a block diagram of an example of three NAND strings in a block of non-volatile storage elements.

Typical architectures for flash memory using NAND structures include many NAND strings. FIG. 3C depicts three NAND strings such as shown in FIGS. 3A-3B in a block BLK0. BLK0 includes a number of NAND strings NS0, NS1, NS2, . . . and respective bit lines, e.g., BL0, BL1, BL2 . . . in communication with respective sense amplifiers SA0, SA1, SA2, . . . BLK0 comprises a set of non-volatile storage elements. Each NAND string is connected at one end to a select gate drain (SGD) transistor, and the control gates of the SGD transistors are connected via a common SGD line. The NAND strings are connected at their other end to a select gate source (SGS) transistor which, in turn, is connected to a common source line (SL). A number of word lines WL0-WL63 extend between the SGS and SGD transistors. WL0 is an edge word line which is adjacent to the source side (SS) of the block and WL63 is an edge word line which is adjacent to the drain side (DS) of the block.

NAND string NS0 includes storage elements 301, . . . , 302-306, . . . , 307 with respective control gates CG63, . . . CG32-CG28, . . . CG0, an SGS transistor 308 with a control gate CGsgs and a SGD transistor 300 with a control gate CGsgd. NAND string NS1 includes storage elements 311, . . . , 312-316, . . . , 317, an SGS transistor 318 and a SGD transistor 310. NAND string NS2 includes storage elements 321, . . . , 322-326, . . . , 327, an SGS transistor 328 and a SGD transistor 320. NAND strings NS0, NS2, . . . are even numbered, and NAND strings NS1, NS3 (not shown), . . . are odd numbered. Similarly, bit lines BL0, BL2, . . . are even numbered, and the NAND strings BL1, BL3 (not shown), . . . are odd numbered. The storage elements can store user data and/or non-user data.

Figure 3D:
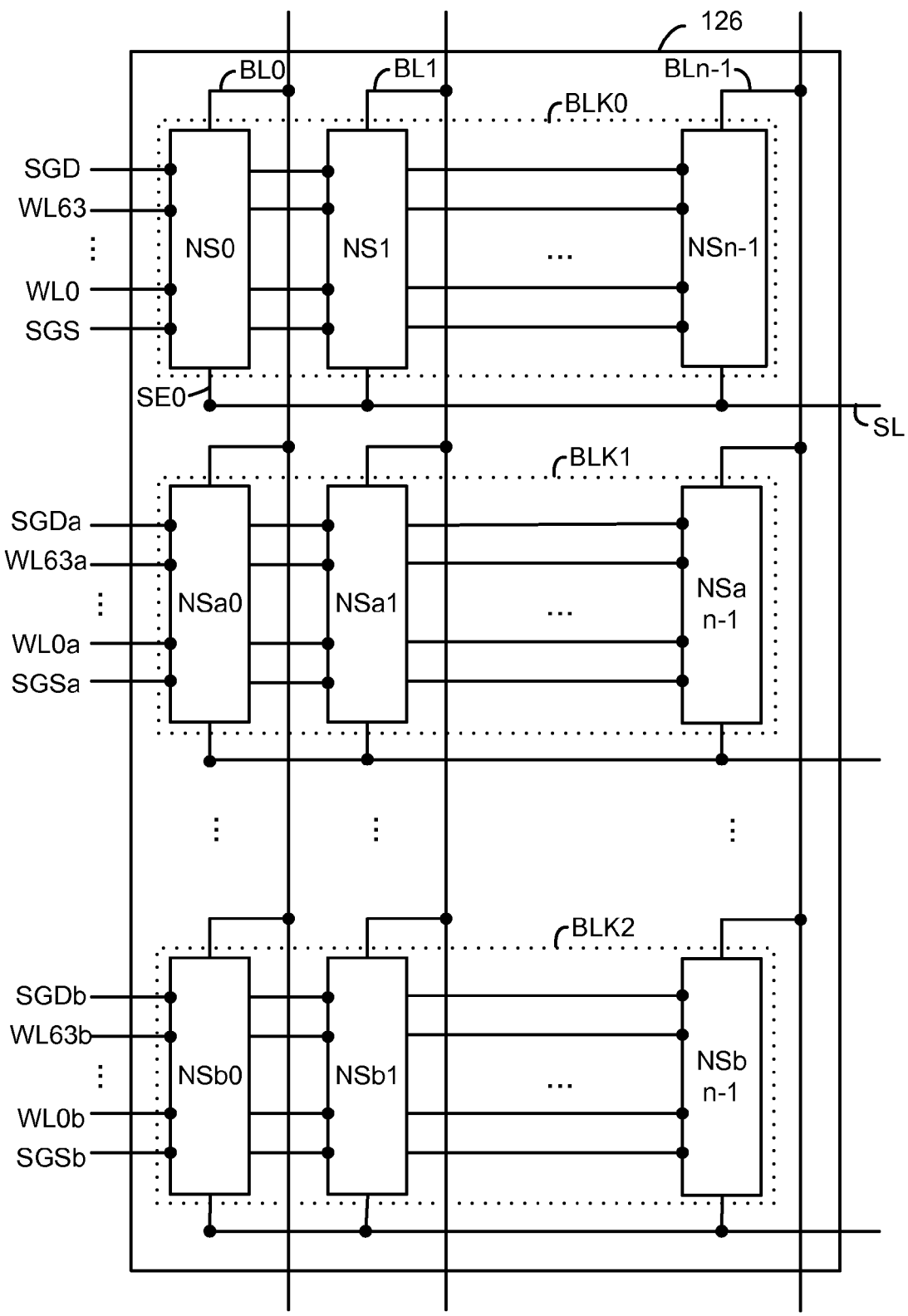
FIG. 3D is a block diagram of an array of NAND flash memory cells arranged into blocks.

FIG. 3D is a block diagram of an array 126 of NAND flash memory cells including BLK0 of FIG. 3C and additional blocks BLK1 and BLK2. Along each column, a bit line (BL) is coupled to the drain terminal of the drain select gate for the NAND string. Along each row of NAND strings, a source line (SL) may connect all the source terminals of the source select gates of the NAND strings (e.g., at SE0 of NS0).

The array of storage elements is divided into a large number of blocks (e.g., BLK0-BLK2) of storage elements, where each block includes a set of one or more NAND strings in communication with a common set of word lines, SGS line and SGD line. Each NAND string is also in communication with a respective bit line. For example, BLK0 includes NAND strings NS0, NS1, . . . , NSn-1 in communication with BL0, BL1, . . . BLn-1, respectively, and with WL0-WL63 SGS and SGD. BLK1 includes NAND strings NSa0, NSa1, . . . , NSan-1 in communication with BL0, BL1, . . . BLn-1, respectively, and with WL0a-WL63a, SGSa and SGDa. BLK2 includes NAND strings NSb0, NSb1, . . . , NSbn-1 in communication with BL0, BL1, . . . BLn-1, respectively, and with WL0b-WL63b, SGSb and SGDb.

It is common for flash EEPROM systems to utilize a block as the unit of erase, which may be referred to as an erase block or physical block. Each block can contain the minimum number of memory cells that are erased together, although multiple blocks may be erased simultaneously. Smaller units of cells may be erased together in some implementations. For example, a partial block erase is performed in some embodiments. Each block is typically divided into a number of pages. A page is the smallest unit of programming. One or more pages of data are stored in storage elements associated with one word line, in one embodiment. For example, a word line of memory cells may contain several interleaved pages or it may constitute one page. All storage elements of a page will be read or programmed together. Moreover, a page can store user data from one or more sectors. A sector is a logical concept used by the host as a convenient unit of user data; it typically does not contain overhead data, which is confined to the controller. Overhead data may include an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than the user data to which they pertain.

A sector of user data is typically 512 bytes, corresponding to the size of a sector in magnetic disk drives. Overhead data is typically an additional 16-20 bytes. A large number of pages form a block, anywhere from 8 pages, for example, up to 32, 64 or more pages. In some embodiments, a row of NAND strings comprises a block.

Figure 4A:
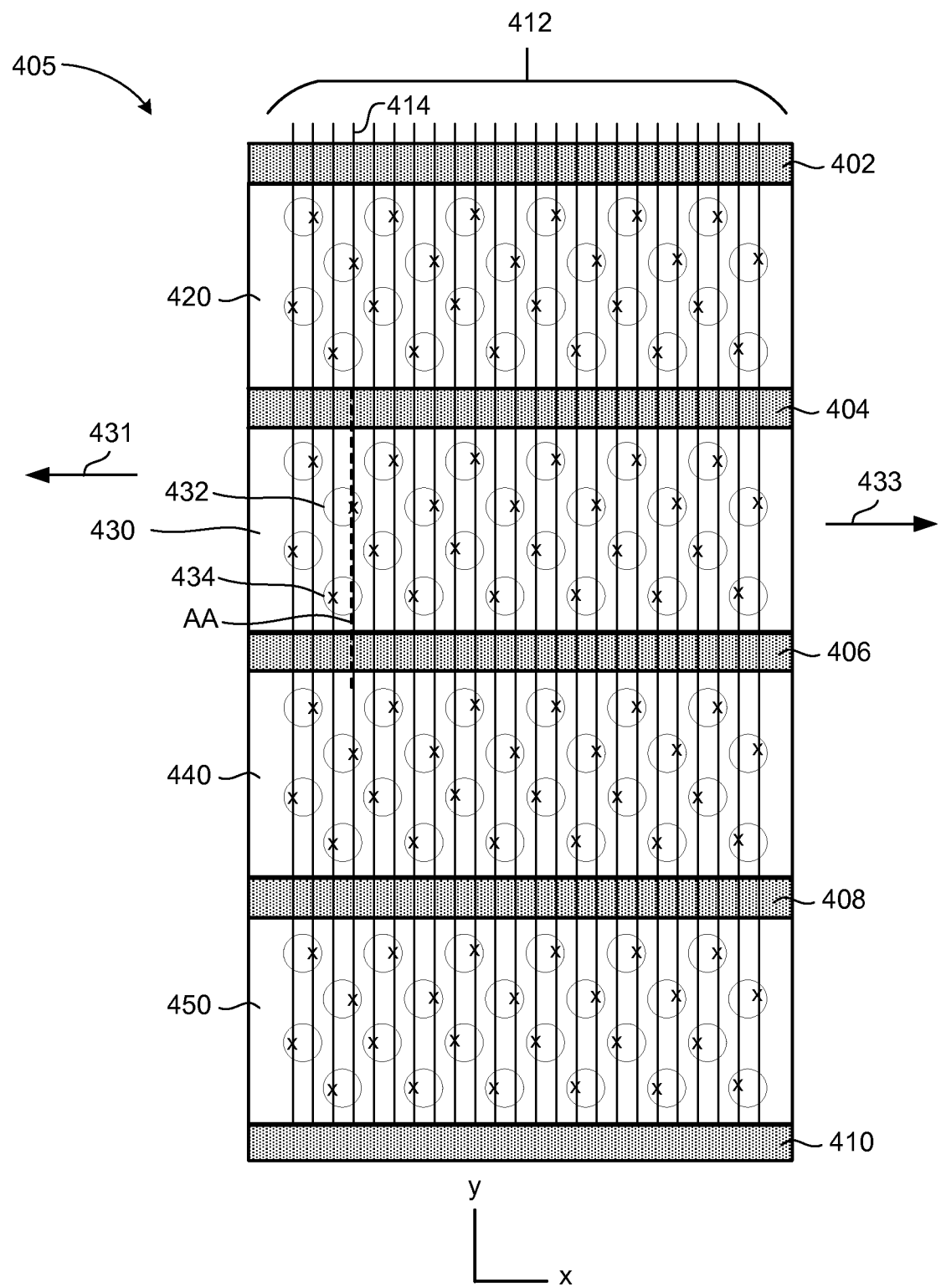
FIG. 4A depicts a top view of a portion of a block of memory cells.

FIG. 4A is a block diagram depicting a top view of a portion of one block from memory structure 126. The portion of the block depicted in FIG. 4A corresponds to portion 405 in block 2 of FIG. 2C. As can be seen from FIG. 4A, the block depicted in FIG. 4A extends in the direction of arrow 431 and in the direction of arrow 433. In one embodiment, the memory array will have 48 layers. Other embodiments have less than or more than 48 layers. However, FIG. 4A only shows the top layer.

FIG. 4A depicts a plurality of circles that represent the vertical columns. Each of the vertical columns include multiple select transistors and multiple memory cells. In one embodiment, each vertical column implements a NAND string. More details of the vertical columns are provided below. Since the block depicted in FIG. 4A extends in the direction of arrow 431 and in the direction of arrow 433, the block includes more vertical columns than depicted in FIG. 4A.

FIG. 4A also depicts a set of bit lines 412. FIG. 4A shows twenty four bit lines because only a portion of the block is depicted. It is contemplated that more than twenty four bit lines connected to vertical columns of the block. Each of the circles representing vertical columns has an "x" to indicate its connection to one bit line.

The block depicted in FIG. 4A includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4A is divided into regions 420, 430, 440 and 450. In the layers of the block that implement memory cells, the four regions are referred to as word line fingers that are separated by the local interconnects. In one embodiment, the word line fingers on a common level of a block connect together at the end of the block to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the managing circuit uses the source side select lines and the drain side select lines to choose one (or another subset) of the four to be subjected to a memory operation (program, verify, read, and/or erase).

Although FIG. 4A shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 4A also shows the vertical columns being staggered. In other embodiments, different patterns of staggering can be used. In some embodiments, the vertical columns are not staggered.

Figure 4B:
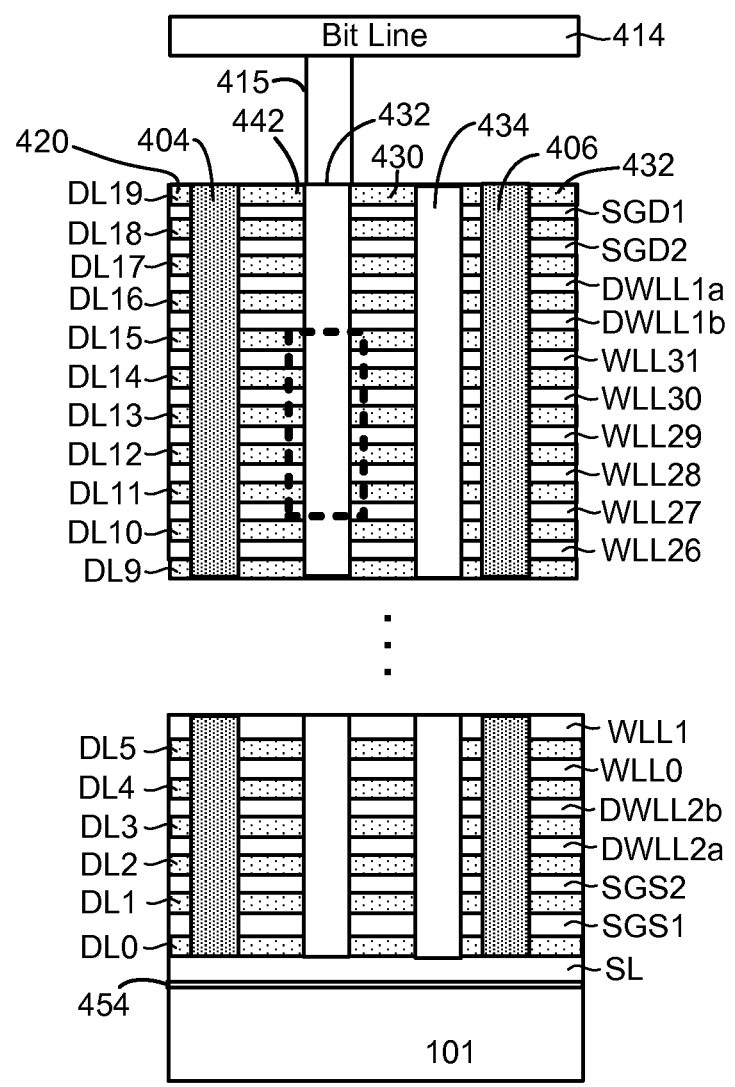
FIG. 4B depicts a cross sectional view of a portion of a block of memory cells.

FIG. 4B depicts a portion of an embodiment of three dimensional memory structure 126 showing a cross-sectional view along line AA of FIG. 4A. This cross sectional view cuts through vertical columns 432 and 434 and region 430 (see FIG. 4A). The structure of FIG. 4B includes two drain side select layers SGD1 and SGD1; two source side select layers SGS1 and SGS2; four dummy word line layers DWLL1a, DWLL1b, DWLL2a and DWLL2b; and thirty two word line layers WLL0-WLL31 for connecting to data memory cells. Oher embodiments can implement more or less than two drain side select layers, more or less than two source side select layers, more or less than four dummy word line layers, and more or less than thirty two word line layers. Vertical columns 432 and 434 are depicted protruding through the drain side select layers, source side select layers, dummy word line layers and word line layers. In one embodiment, each vertical column comprises a NAND string. Below the vertical columns and the layers listed below is substrate 101, an insulating film 454 on the substrate, and source line SL. The NAND string of vertical column 432 has a source end at a bottom of the stack and a drain end at a top of the stack. As in agreement with FIG. 4A, FIG. 4B show vertical column 432 connected to Bit Line 414 via connector 415. Local interconnects 404 and 406 are also depicted.

For ease of reference, drain side select layers SGD1 and SGD1; source side select layers SGS1 and SGS2; dummy word line layers DWLL1a, DWLL1b, DWLL2a and DWLL2b; and word line layers WLL0-WLL31 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DLO-DL19. For example, dielectric layers DL10 is above word line layer WLL26 and below word line layer WLL27. In one embodiment, the dielectric layers are made from $SiO_2$. In other embodiments, other dielectric materials can be used to form the dielectric layers.

The memory cells are formed along vertical columns which extend through alternating conductive and dielectric layers in the stack. In one embodiment, the memory cells are arranged in NAND strings. The word line layer WLL0-WLL31 connect to memory cells (also called data memory cells). Dummy word line layers DWLL1a, DWLL1b, DWLL2a and DWLL2b connect to dummy memory cells. A dummy memory cell, also referred to as a non-data memory cell, does not store user data, while a data memory cell is eligible to store user data. Thus, data memory cells may be programmed. Drain side select layers SGD1 and SGD1 are used to electrically connect and disconnect NAND strings from bit lines. Source side select layers SGS1 and SGS2 are used to electrically connect and disconnect NAND strings from the source line SL.

FIG. 4C depicts a perspective view of the conductive layers (SGD1, SGD1, SGS1, SGS2; DWLL1a, DWLL1b, DWLL2a, DWLL2b, and WLL0-WLL31) for the block that is partially depicted in FIG. 4C. As mentioned above with respect to FIG. 4A, local interconnects 401, 404, 406, 408 and 410 break up each conductive layers into four regions. For example, drain side select gate layer SGD1 (the top layer) is divided into regions 420, 430, 440 and 450. Similarly, word line layer WLL31 is divided into regions 460, 462, 464 and 466. For word line layers (WLL0-WLL31), the regions are referred to as word line fingers; for example, word line layer WLL31 is divided into word line fingers 460, 462, 464 and 466.

Figure 4D:
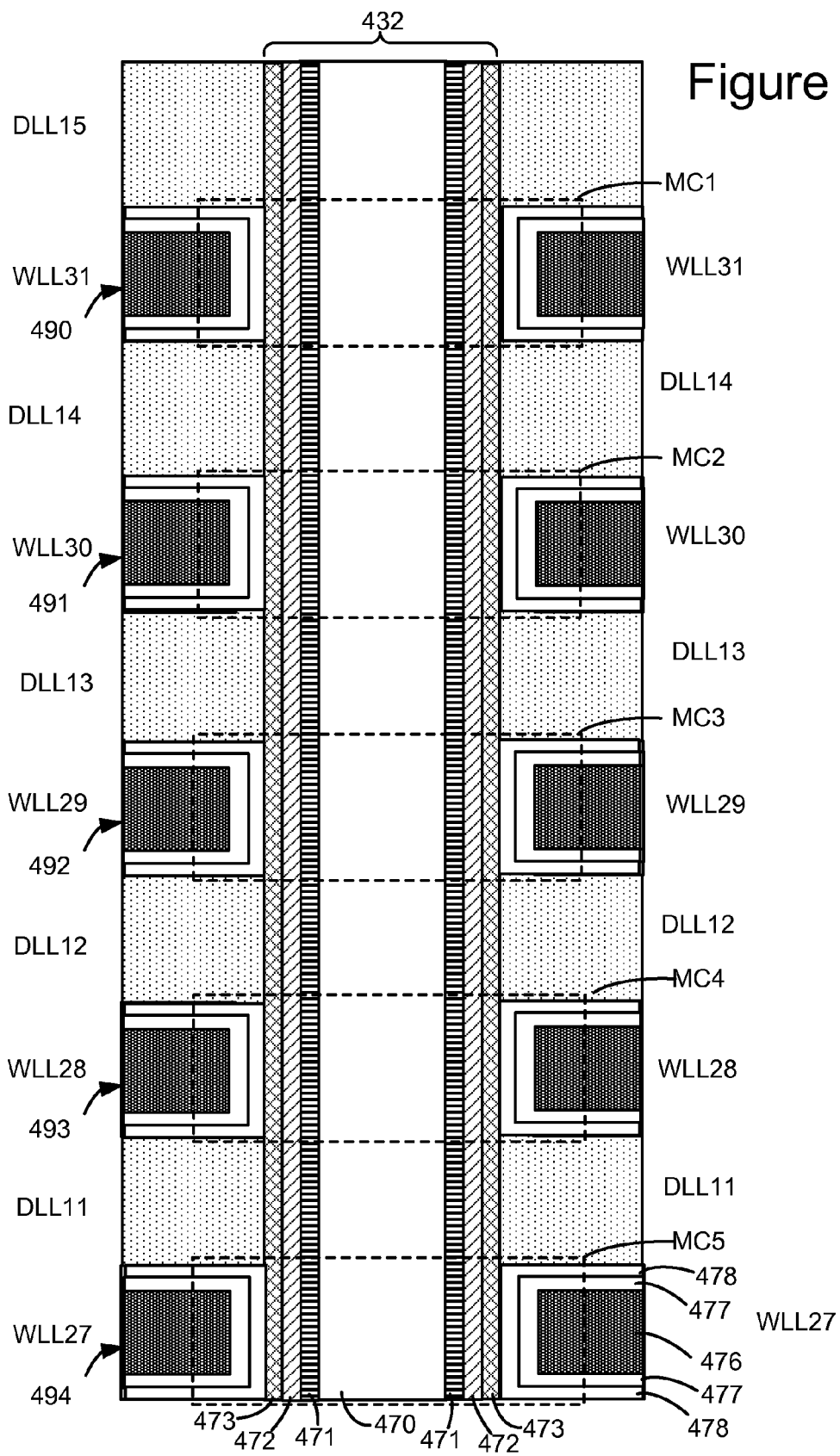
FIG. 4D is a cross sectional view of a vertical column of memory cells.

FIG. 4D depicts a cross sectional view of region 442 of FIG. 4B that includes a portion of vertical column 432. In one embodiment, the vertical columns are round and include four layers; however, in other embodiments more or less than four layers can be included and other shapes can be used. In one embodiment, vertical column 432 includes an inner core layer 470 that is made of a dielectric, such as $SiO_2$. Other materials can also be used. Surrounding inner core 470 is polysilicon channel 471. Materials other than polysilicon can also be used. Note that it is the channel 471 that connects to the bit line. Surrounding channel 471 is a tunneling dielectric 472. In one embodiment, tunneling dielectric 472 has an ONO structure. Surrounding tunneling dielectric 472 is charge trapping layer 473, such as (for example) a specially formulated silicon nitride that increases trap density.

FIG. 4D depicts dielectric layers DLL11, DLL12, DLL13, DLL14 and DLL15, as well as word line layers WLL27, WLL28, WLL29, WLL30, and WLL31. Each of the word line layers includes a word line region 476 surrounded by an aluminum oxide layer 477, which is surrounded by a blocking oxide (Sift) layer 478. The physical interaction of the word line layers with the vertical column forms the memory cells. Thus, a memory cell comprises channel 471, tunneling dielectric 472, charge trapping layer 473, blocking oxide layer 478, aluminum oxide layer 477 and word line region 476. For example, word line layer WLL31 and a portion of vertical column 432 comprise a memory cell MC1. Word line layer WLL30 and a portion of vertical column 432 comprise a memory cell MC2. Word line layer WLL29 and a portion of vertical column 432 comprise a memory cell MC3. Word line layer WLL28 and a portion of vertical column 432 comprise a memory cell MC4. Word line layer WLL27 and a portion of vertical column 432 comprise a memory cell MC5.

When a memory cell is programmed, electrons are stored in a portion of the charge trapping layer 473 which is associated with the memory cell. These electrons are drawn into the charge trapping layer 473 from the channel 471, through the tunneling layer 473, in response to an appropriate voltage on word line region 476. The threshold voltage ($V_T$) of a memory cell is increased in proportion to the amount of stored charge. During an erase operation, the electrons return to the channel.

FIGS. 5A-5B depict a three-dimensional NAND stacked non-volatile memory device including an array of alternating conductive and dielectric layers disposed above a substrate as may also be used in accordance with one embodiment. A memory hole is drilled in the layers to define many memory layers simultaneously. A NAND string is then formed by filling the memory hole with appropriate materials. Control gates of the memory cells are provided by the conductive layers. Each NAND string has a first "drain" end coupled via a drain-side select gate transistor ("SGD") to a bit line, and a second "source" end coupled via a source-side select gate transistor ("SGS") to a common source conductor. SGD and SGS may be used to selectively couple the drain and source ends, respectively, of a NAND string to the bit line and source line, respectively.

FIG. 5A illustrates a TCAT (Terabit Cell Array Transistor) array 50a, and FIG. 5B illustrates a BiCS (Bit Cost Scalable) array 50b. TCAT array 50a includes a NAND string 52a disposed above a substrate 54a. NAND string 52a has a drain end 56a coupled via SGD 58a to a bit line 60a, and a source end 62a coupled via SGS 64a to a source line 66a. BiCS array 110b includes a NAND string 112b disposed above a substrate 114b. NAND string 52b has a drain end 56b coupled via SGD 58b to a bit line 60b, and a source end 62b coupled via SGS 64b to a source line 66b.

Select gates SGD 116a and SGS 120a, and SGD 16b and SGS 120b are implemented above substrates 114a and 114b, respectively. SGD 116a and SGS 120a, and SGD 116b and SGS 120b consume a significant amount of area. Other 3D NAND non-volatile memory devices may include select gate transistors (SGD or SGS) disposed in the substrate below the NAND strings. In particular, 3D NAND memory arrays may include buried word lines as selector devices of select gate transistors (SGD or SGS).

Figure 6:
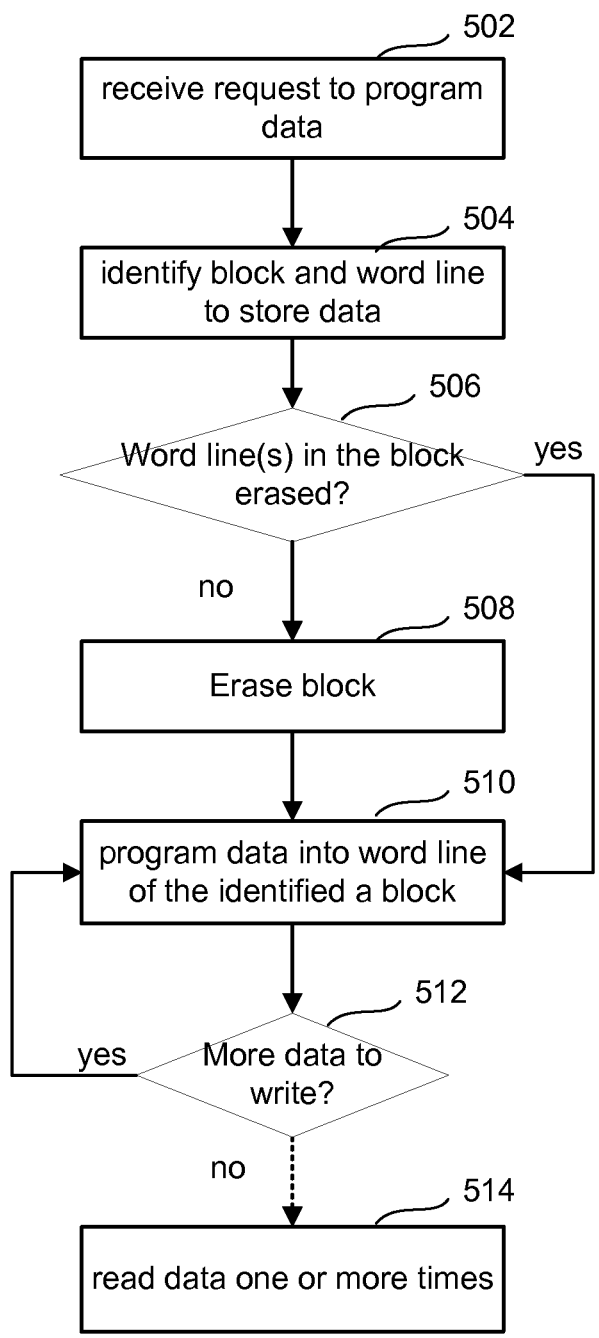
FIG. 6 is a flow chart describing one embodiment of a process for making and operating a non-volatile memory system.

FIG. 6 is a flow chart describing one embodiment of a process for operating a non-volatile storage system. This process pertains to programming one or more word lines in a block. The block may be a completely open block or a partially programmed block. Various steps the process may by performed by the managing circuity, such as one or more of control circuitry 110, state machine 112, decoders 114/124/132, storage 113, power control module 116, sense blocks SB1, SB2, . . . , SBp, and/or read/write circuits 128.

In step 502, a request for programming is received from the Host, the Controller or other entity. The request could be to store one or more pages of data. This request does not necessarily identify the block to be programmed. For example, a request from the host might not specify the block.

In step 504, the controller 122 (or state machine or other entity) will identify a block and one or more word lines to program the page(s) of data. For ease of explanation, it will be assumed that the request can be satisfied by programming no more than one block. Step 504 may include the controller 122 identifying a block that is already partially programmed. Of course, in some cases the data is stored into a block that is completely unprogrammed. Step 504 is not required to be performed by the controller.

Step 506 is a check to determine whether the word line(s) in the block into which the data is to be programmed is/are erased. Note that for a partially programmed block, some word lines may be erased and others programmed. By a word line being erased, it is meant that the memory cells associated with the word line are erased. In one embodiment, controller 122 performs step 506. However, step 506 is not required to be performed by the controller.

The block is erased in step 508, if needed. The system does not erase valid data in step 508. Thus, if there is valid data in the block, this data is saved prior to the erase. In one embodiment, the controller 122 sends a command to the memory die, instructing it which block to erase. Note that this step may erase the entire block, even if request can be satisfied by programmed just a region of the block. Erasing in 2D NAND is typically different than 3D NAND. The following describes how memory cells can be programmed in 2D NAND. In 2D NAND, the memory cells of one block may reside within the same p-well. Memory cells in 2D NAND are erased in one embodiment by raising the p-well to an erase voltage (e.g., 15-20 V) for a sufficient period of time and grounding or applying a low bias, e.g., 1 V, on the word lines of a selected block while the source and bit lines are floating. In blocks that are not selected to be erased, word lines are floated. Due to capacitive coupling, the unselected word lines, bit lines, select lines, and the common source line are also raised to a significant fraction of the erase voltage thereby impeding erase on blocks that are not selected to be erased. In blocks that are selected to be erased, a strong electric field is applied to the tunnel oxide layers of selected memory cells and the selected memory cells are erased as electrons of the floating gates are emitted to the substrate side, typically by Fowler-Nordheim tunneling mechanism. As electrons are transferred from the floating gate to the p-well region, the threshold voltage of a selected cell is lowered. Erasing can be performed on the entire memory array, on individual blocks, or another unit of memory cells. One implementation of an erase process includes applying several erase pulses to the p-well and verifying between erase pulses whether the NAND strings are properly erased.

One approach to erasing in a 3D stacked non-volatile memory device is to generate gate induced drain leakage (GIDL) current to charge up the NAND string channel, raise the channel potential to an erase voltage, and maintain this channel potential during erase. In one approach, the memory device includes NAND strings which have a drain-side select gate (SGD) transistor on one end and a source-side select gate (SGS) transistor on the other end. The erase may be a "one-sided erase" or a "two-sided erase." When an erase voltage is applied to the bit line in a one-sided erase, or to the bit line and source line in a two-sided erase, the select gate transistors generate a sufficient amount of gate-induced drain leakage (GIDL) current to charge up the floating body (channel) of the NAND string. GIDL increases in proportion to the drain-to-gate voltage (Vdg) of the select gate transistors.

In step 510, at least a portion of the data received for the request is programmed into memory cells into the identified region of the block. In one embodiment, controller 122 sends a command to a memory die 108, instructing it which block and word line(s) to program. This command may instruct the memory die to program more than one word line.

Step 512 is a check to determine if more data needs to be written to complete the request from step 502. If so, the next word line is programmed by repeating step 510. The check of step 512 may be performed by memory die 108.

In step 514, the data can be read. The dashed line between steps 512 and 514 indicates that there can be an unpredictable amount of time between the steps. Note that the steps of the process of FIG. 6 (as well as the other processes in the other Figures) need not be performed by the same entity, or in the same order as depicted.

Also note that after the request to write data is complete, the block that was written may be partially programmed. This block may or may not have been erased in step 508. If another request is received at a later time to program data into an open region of such a partially programmed block, it is not required to erase the block, since the erase of step 508 erased the entire block. Thus, it is possible to write to the open region without an additional erase. However, note that considerable time may pass until the next request is received to program data into the now partially programmed block. Hence, memory cells in such a partially programmed block may sit in the erased state for a significant time.

Figure 7:
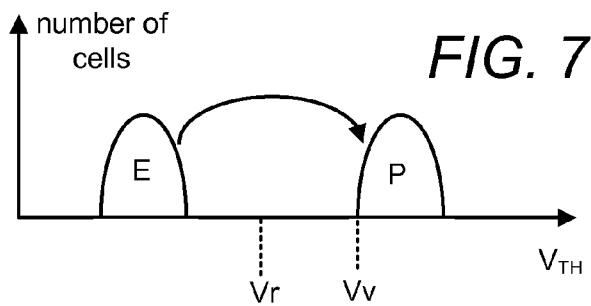
FIG. 7 is a flow chart describing one embodiment of a process for programming data into a block of memory cells.

FIG. 7 illustrates example threshold voltage distributions for the memory cell array when each memory cell stores one bit of data. Other embodiments, however, may use more than one bit of data per memory cell (e.g., such as two, three, or four bits of data per memory cell). FIG. 7 shows two threshold voltage distributions (corresponding to two data states). The first threshold voltage distribution (data state) E represents memory cells that are erased. The second threshold voltage distribution (data state) P represents memory cells that are programmed. The curved arrow indicates the programming process where some memory cells are programmed to go from E to P. In one embodiment, memory cells in data state E store a logical "1" and memory cells in data state P store a logical "0." In one embodiment, the threshold voltages in E are negative and the threshold voltages in P are positive. FIG. 7 also depicts a read reference voltage Vr and verify reference voltage Vv. By testing whether the threshold voltage of a given memory cell is above or below Vr, the system can determine whether the memory cell is erased (E) or programmed (P). When programming memory cells, the system will test whether those memory cells have a threshold voltage greater than or equal to Vv.

Figure 8:
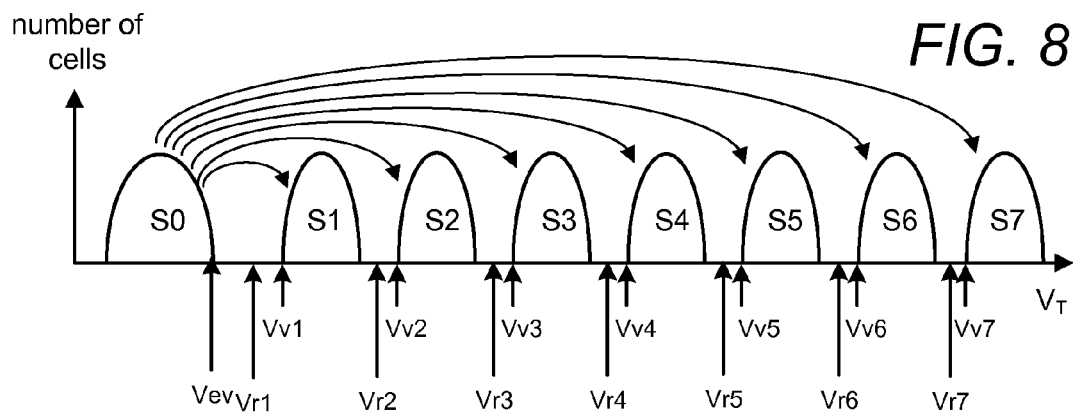
FIG. 8 depicts an example set of threshold voltage distributions and describes a process for programming non-volatile memory.

FIG. 8 illustrates example threshold voltage distributions for the memory cell array when each memory cell stores three bits of data. Other embodiments, however, may use more or less than three bits of data per memory cell (e.g., such as three bits of data per memory cell). In the example of FIG. 8, each memory cell stores three bits of data; therefore, there are eight valid threshold voltage distributions, also called data states: S0, S1, S2, S3, S4, S5, S6 and S7. In one embodiment, data state S0 is below 0 volts and data states S1-S7 are above 0 volts. In other embodiments, all eight data states are above 0 volts, or other arrangements can be implemented. In one embodiment, the threshold voltage distribution for S0 is wider than for S1-S7. In one embodiment, S0 is for erased memory cells. Data is programmed from S0 to S1-S7.

Each data state corresponds to a unique value for the three data bits stored in the memory cell. In one embodiment, S0=111, S1=110, S2=101, S3=100, S4=011, S5=010, S6=001 and S7=000. Other mapping of data to states S0-S7 can also be used. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a floating gate erroneously shifts to its neighboring threshold voltage distribution, only one bit will be affected. However, in other embodiments, Gray code is not used.

In one embodiment, all of the bits of data stored in a memory cell are stored in the same logical page. In other embodiments, each bit of data stored in a memory cell corresponds to different logical pages. Thus, a memory cell storing three bits of data would include data in a first page, data in a second page and data in a third page. In some embodiments, all of the memory cells connected to the same word line would store data in the same three pages of data. In some embodiments, the memory cells connected to a word line can be grouped into different sets of pages (e.g., by odd and even bit lines, or by other arrangements).

In some devices, the memory cells will be erased to state S0. From state S0, the memory cells can be programmed to any of states S1-S7. In one embodiment, known as full sequence programming, memory cells can be programmed from the erased state S0 directly to any of the programmed states S1-S7. For example, a population of memory cells to be programmed may first be erased so that all memory cells in the population are in erased state S0. While some memory cells are being programmed from state S0 to state S1, other memory cells are being programmed from state S0 to state S2, state S0 to state S3, state S0 to state S4, state S0 to state S5, state S0 to state S6, and state S0 to state S7. Full sequence programming is graphically depicted by the seven curved arrows of FIG. 8.

FIG. 8 shows a set of verify target levels Vv1, Vv2, Vv3, Vv4, Vv5, Vv6, and Vv7. These verify levels are used as comparison levels (also known as target levels and/or compare levels) during the programming process. For example, when programming memory cells to state S1, the system will check to see if the threshold voltages of the memory cells have reached Vv1. If the threshold voltage of a memory cell has not reached Vv1, then programming will continue for that memory cell until its threshold voltage is greater than or equal to Vv1. If the threshold voltage of a memory cell has reached Vv1, then programming will stop for that memory cell. Verify target level Vv2 is used for memory cells being programmed to state S2. Verify target level Vv3 is used for memory cells being programmed to state S3. Verify target level Vv4 is used for memory cells being programmed to state S4. Verify target level Vv5 is used for memory cells being programmed to state S5. Verify target level Vv6 is used for memory cells being programmed to state S6. Verify target level Vv7 is used for memory cells being programmed to state S7.

FIG. 8 also shows a set of read compare levels Vr1, Vr2, Vr3, Vr4, Vr5, Vr6, and Vr7. These read compare levels are used as comparison levels during the read process. By testing whether the memory cells turn on or remain off in response to the read compare levels Vr1, Vr2, Vr3, Vr4, Vr5, Vr6, and Vr7 being separately applied to the control gates of the memory cells, the system can determine for which states that memory cells are storing data.

In general, during verify operations and read operations, the selected word line is connected to a voltage (one example of a reference signal), a level of which is specified for each read operation (e.g., see read compare levels Vr1, Vr2, Vr3, Vr4, Vr5, Vr6, and Vr7, of FIG. 8) or verify operation (e.g. see verify target levels Vv1, Vv2, Vv3, Vv4, Vv5, Vv6, and Vv7 of FIG. 8) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

Figure 9:
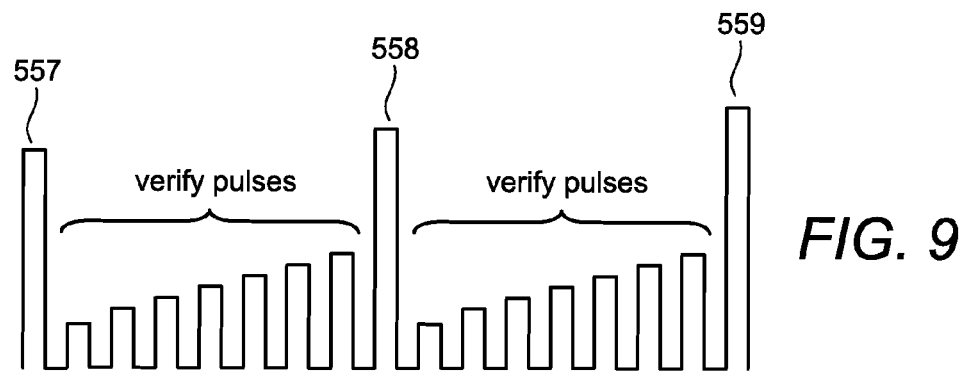
FIG. 9 shows programming pulses with a set of verify pulses between the programming pulses.
Figure 10:
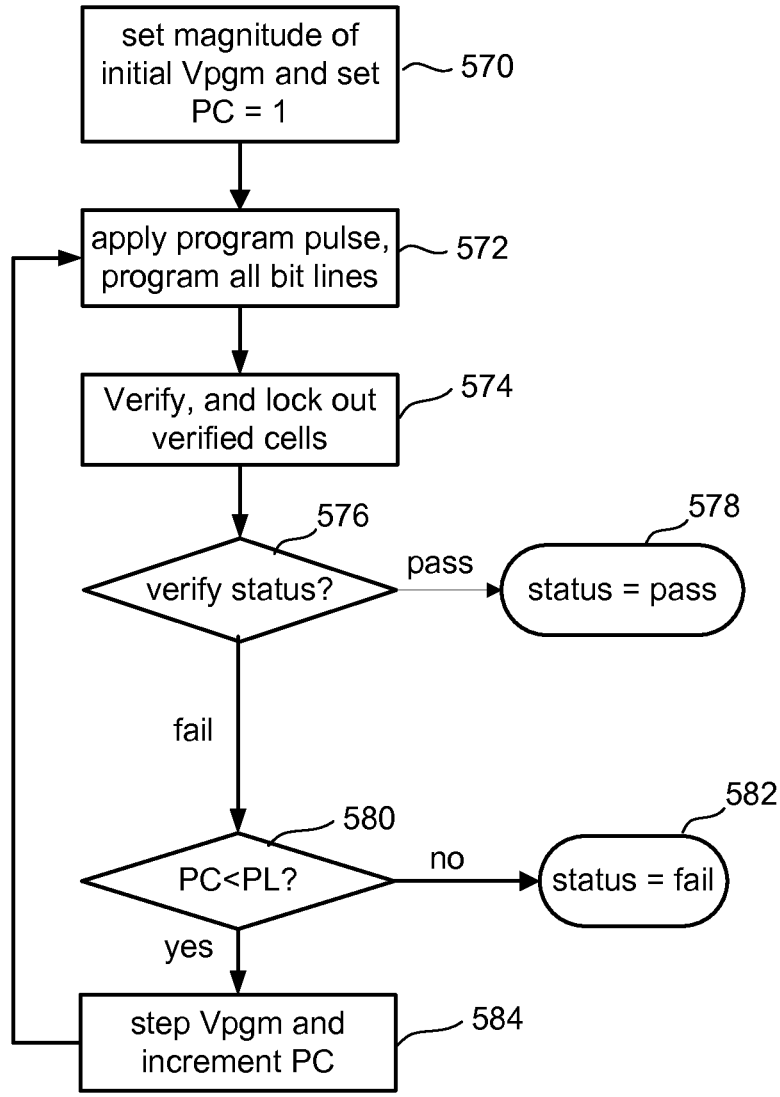
FIG. 10 is a flow chart describing one embodiment of a process for performing programming on memory cells.
Figure 11:
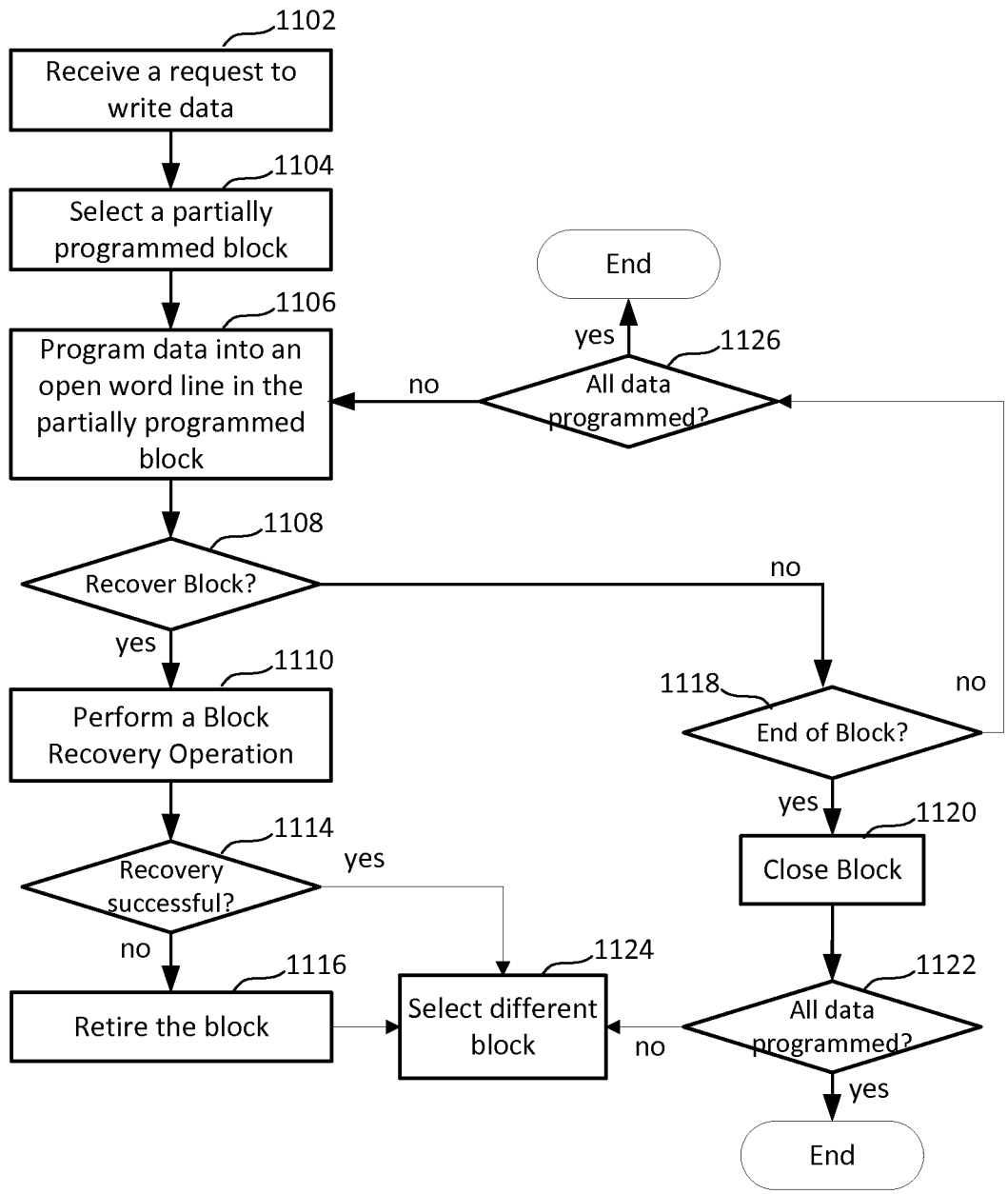
FIG. 11 is a flowchart of one embodiment of a process for programming data into non-volatile storage elements including a recovery of a partially programmed block.

In some embodiments, the program voltage applied to the control gate includes a series of pulses that are increased in magnitude with each successive pulse by a predetermined step size (e.g. 0.2 v, 0.3 v, 0.4 v, or others). Between pulses, some memory systems will verify whether the individual memory cells have reached their respective target threshold voltage ranges. For example, FIG. 10 shows a portion of a signal applied to the control gates of a plurality of memory cells connected to a common word line. FIG. 9 shows programming pulses 557, 558 and 559, with a set of verify pulses between the programming pulses. When performing full sequence programming in one embodiment, the verification process between programming pulses will test for each of the threshold voltage distribution (data states) S1-S7. Therefore, FIG. 11 shows seven verify pulses that have magnitudes corresponding to verify target levels Vv1, Vv2, Vv3, Vv4, Vv5, Vv6, and Vv7. In some embodiments, one or more of the verify operations can be skipped (and, therefore one or more of the verify pulses can be skipped) because the verify operation is not necessary or superfluous. For example, if none of the memory cells being programmed according to FIG. 0 have reached Vv2, there is no reason to verify at Vv7.

FIG. 10 is a flow chart describing one embodiment of a process for performing programming on memory cells connected to a common word line to one or more targets (e.g., data states or threshold voltage ranges). The process of FIG. 10 can be performed one or multiple times during step 510 of FIG. 6. For example, the process of FIG. 10 can be used to program memory cells from erased data state E to programmed data state P of FIG. 7; from data state S0 of FIG. 8 to any of data states S1-S7 performing full sequence programming, and any stage of a multi-stage programming process. The process in FIG. 10 may be performed for each word line separately during a programming operation. Moreover, FIG. 10 may be performed for each stage of programming at each word line. Various steps of the process may by performed by the managing circuity, such as one or more of control circuitry 110, state machine 112, decoders 114/124/132, storage 113, power control module 116, sense blocks SB1, SB2, . . . , SBp, and/or read/write circuits 128.

Typically, the program voltage applied to the control gate during a program operation is applied as a series of program pulses. Between programming pulses are a set of verify pulses to perform verification, as depicted (for example) in FIG. 9. In many implementations, the magnitude of the program pulses is increased with each successive pulse by a predetermined step size. In step 570 of FIG. 10, the programming voltage (Vpgm) is initialized to the starting magnitude (e.g., ~12-16V or another suitable level) and a program counter PC maintained by state machine 222 is initialized at 1. In step 572, a program pulse of the program signal Vpgm is applied to the selected word line (the word line selected for programming). In one embodiment, the group of memory cells being programmed concurrently are all connected to the same word line (the selected word line). The unselected word lines receive one or more boosting voltages (e.g., ~7-11 volts) to perform boosting schemes known in the art. If a memory cell should be programmed, then the corresponding bit line is grounded. On the other hand, if the memory cell should remain at its current threshold voltage, then the corresponding bit line is connected to VDD to inhibit programming. In step 572, the program pulse is concurrently applied to all memory cells connected to the selected word line so that all of the memory cells connected to the selected word line are programmed concurrently. That is, they are programmed at the same time (or during overlapping times). In this manner all of the memory cells connected to the selected word line will concurrently have their threshold voltage change, unless they have been locked out from programming.

In step 574, the appropriate memory cells are verified using the appropriate set of target (compare) levels to perform one or more verify operations. In one embodiment, the verification process is performed by applying the testing whether the threshold voltages of the memory cells selected for programming have reached the appropriate verify compare voltage (Vv1, Vv2, Vv3, Vv4, Vv5, Vv6, and Vv7). Note that this test may verify whether the memory $V_T$ is at least at the proper verify level. However, this test does not typically test for over-programmed memory cells.

In step 576, it is determined whether enough of the memory cells have reached their target threshold voltages (pass). If so, the programming process is complete because enough of selected memory cells were programmed and verified to their target states. Thus, process concludes with a status of pass, in step 578. Note that the process may complete even a predetermined number of the memory cells fail to reach their verify level. In one embodiment, the predetermined number is based on the number of bits that can be corrected by ECC during a read process for the page of memory cells. If the number of failed cells is less than or equal to the predetermined limit, than the programming process can stop. In this situation, enough memory cells programmed correctly such that the few remaining memory cells that have not been completely programmed can be corrected using ECC during the read process.

In another embodiment, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

Returning again to the discussion of step 576, if it is determined that not enough of the memory cells have reached their target threshold voltages (fail), then the programming process continues to step 580. In step 580, the program counter PC is checked against the program limit value (PL). Examples of program limit values include 20 and 30; however, other values can be used. If the program counter PC is not less than the program limit value PL, then the program process is considered to have failed and a status of FAIL is reported in step 582. Also, the block recovery operation is performed in step 588.

If the program counter PC is less than the program limit value PL, then the process continues at step 584 during which time the Program Counter PC is incremented by 1 and the program voltage Vpgm is stepped up to the next magnitude. For example, the next pulse will have a magnitude greater than the previous pulse by a step size (e.g., a step size of 0.1-0.4 volts). After step 584, the process loops back to step 572 and another program pulse is applied to the selected word line.

FIG. 11 is a flowchart of one embodiment of a process 1100 for programming data into non-volatile storage elements (or memory cells) in a partially programmed block of a non-volatile storage device. Note that this process 1100 assumes that there are one or more partially programmed blocks in the non-volatile storage device. Thus, prior to this process 1100, data has already been programmed into at least one of the blocks, resulting in one or more partially programmed blocks. A considerable amount of time may pass between the initial programming of the partially programmed blocks and performance of the process 1100. It is possible for charge to become trapped in the tunnel dielectric of the non-volatile storage elements of partially programmed blocks. Process 1100 performs a recovery operation that can reduce or eliminate the trapped charge in the tunnel dielectric. Therefore, programming is improved. Also data retention is improved. The recovery operation may solve other problems as well. Process 1100 refers to actions that occur at a memory die 108, in one embodiment. However, some of the actions could occur elsewhere. Various steps of process 1100 may by performed by the managing circuitry, such as one or more of control circuitry 110, state machine 112, decoders 114/124/132, storage 113, power control module 116, sense blocks SB1, SB2, . . . , SBp, and/or read/write circuits 128.

In step 1102, a request to program data into the non-volatile storage device is received. This request is to program one or more pages of data, in one embodiment. The amount of data to be programmed can vary. The data could be less than a block of memory cells can hold. The data could be more than one block of memory cells can hold. In one embodiment, the controller 122 receives a request from the host 140. The request may specifies one or more pages of data to write. This request does not necessarily specify which block in the memory array to write.

In step 1104, a partially programmed block is selected for programming at least a portion of the data. In one embodiment, step 1104 includes the controller 122 selecting a partially programmed block that will satisfy the request from the host 140. Thus, the controller 122 may have logic that determines what block should be selected for programming, in one embodiment.

In one embodiment, the controller 122 formulates a program request to the memory die 108 based on a request from the host 140. The program request from the controller 122 might specify a die (or logical unit number), a block number, as well as a page. In one embodiment, the request from the controller 122 to the memory die 108 is compliant with a version of the Open NAND Flash Interface (ONFI). However, the request is not required to be ONFI compliant. Also, the request is not required to be to program NAND Flash. That is, the memory array is not required to be NAND Flash. Note that step 1104 may also include the memory die 108 selecting a particular block based on the command from the controller 122. Also note that considerable time may have passed since other memory cells in the partially programmed block were programmed.

In step 1106, data is programmed to an open word line in the selected partially programmed block. For example, one or more pages of data are programmed into memory cells associated with an open word line in the selected partially programmed block.

In step 1108, a determination is made whether a recovery operation of the partially programmed block should be made. In one embodiment, step 1108 includes determining whether a fail bit count is above a threshold. Thus, step 1108 may include determining a fail bit count (FBC) with respect to programming the data to the open word line. The FBC refers to how many memory cells were not programmed to their intended state. The FBC may be determined as soon as the programming operation is complete. If the FBC is too high, this may be an indication that a recovery operation should be performed on the partially programmed block.

In one embodiment, step 1108 includes an optional erratic program detection (EPD) test. Erratic program detection tests for whether memory cells were programmed to their intended state. The EPD test may determine whether memory cells are over-programmed and/or under-programmed. An example of an over-programmed memory cell is one with a $V_T$ above the read reference level for the next highest state. For example, of the memory cell was supposed to be programmed to the S3 state, but its $V_T$ is greater than Vr4 (see FIG. 8), the memory cell is over-programmed. An example of an under-programmed memory cell is one with a $V_T$ below the read level for its state. For example, of the memory cell was supposed to be programmed to the S3 state, but its $V_T$ is less than Vr3 (see FIG. 8), the memory cell is under-programmed. Note that this test is not the same for program verify, which would test for Vv3. The foregoing are examples of over- and under-programming, but other test and reference levels could be used. For example, over-programming might test for a reference level other than the read reference level of the next highest state. Likewise, under-programming might test for a reference level other than the read reference level of that state. In one embodiment, EPD makes a count of memory cells that were not programmed to their intended state. This may be referred to as a fail bit count (FBC). To determine the FBC, the system counts the number of cells that are not programmed to their intended state. This counting can be done by the state machine, the controller, or other logic.

Thus, step 1108 may determine whether EPD passes. This step may compare the FBC with a pre-determined number of memory cells that are allowed to fail the test. If the EPD test passes, then the process may continue at step 1118. Step 1118 will be discussed below. If EPD fails, then a block recovery operation is performed in step 1110. The block recovery operation reduces or eliminates charged trapped in the tunnel dielectric of memory cells, in one embodiment. Further details are discussed below.

Step 1110 includes performing the recovery operation. The recovery operation is performed on memory cells in the open region of the block other than those that were just programmed, in one embodiment. The recovery operation may remove trapped charge from the tunnel dielectric of the memory cells. This can place the memory cells into better condition such that programming and data retention is improved. The recovery operation includes performing one or more erase operations at least in the open region of the block, in one embodiment. Further details are discussed below.

After the recovery operation is performed, step 1114 is performed to determine whether the recovery operation was successful. Step 1114 may include analyzing a FBC after waiting some period of time after the recovery operation was performed. Note that data retention problems typically do not appear until some time after programming is complete. Thus, even if programming completes with a fairly low FBC, there still could be a data retention problem. As discussed above, the partially programmed block may have some electrons trapped in the tunnel dielectric region of the memory cells. If the recovery operation does not remove enough of the trapped electrons, there might be a data retention problem. Step 1114 tests for a data retention problem in one embodiment.

In one embodiment of step 1114, an FBC is determined for test data. If the FBC is too high, then this indicates that the recovery operation was not successful. In this case, the block is retired (step 1116).

In some cases, a successful block recovery operation may result in some dummy data pattern being written into at least a region of the partially programmed block. Although the partially programmed block has been recovered such that it is available for storing data, it is not necessarily used at this time. In this case, process 1100 may select a different block at step 1124 for finishing the original request from step 1102. This could include selecting a different partially programmed block, as was done in step 1104. Note that in some embodiments, the block recovery process transfers the valid data from the partially programmed block to a different block. In this case, programming may continue with that partially programmed block. Also note that in this case, the data that was to be programmed in the previous iteration of step 1106 might not have been programmed yet.

Returning again to step 1108, if there is not a need to recover the block, then it is assumed that the write operation from step 1106 was successful. Thus, by the time step 1118 is performed, the programming of the data that started in step 1106 has successfully completed. In this case, step 1118 is a test to determine if the end of the block has been reached. In other words, step 1118 tests for whether the block is now full. If the block is not yet full (step 1118=no), then step 1126 is performed to determine whether all of the data has been programmed. That is, step 1126 is to determine whether the program request from step 1102 has been satisfied. If not (step 1126=no), the step 1106 is performed again. However, this time step 1106 programs a different open word line in the partially programmed block with different data. Process 1100 then continues on as previously described.

On the other hand, if the end of the block was reached (step 1118=yes), then the block is closed in step 1120. By closing the block, it is meant that the block is no longer open for more data. Step 1122 includes determining whether more data needs to be programmed to satisfy the request from step 1102. If not (step 1122=yes), then process 1100 ends. If there is more data to be programmed, then a different block is selected in step 1124. The new block could be a partially programmed block or one that is completely open. If the new block is a partially programmed block, this essentially means that step 1124 equates to step 1104. In this case, process 1100 continues on from step 1104 as previously described.

Figure 12:
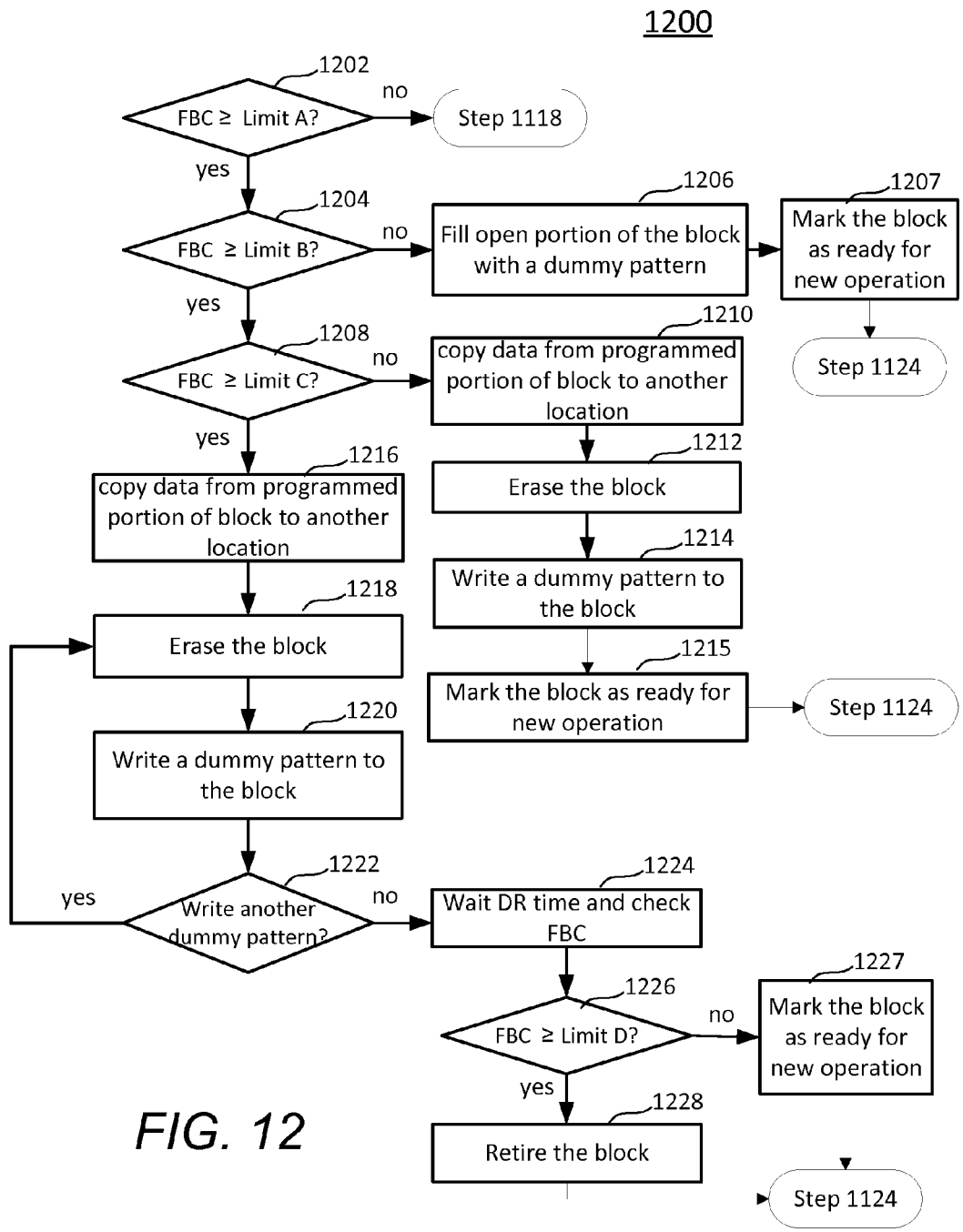
FIG. 12 is a flowchart of one embodiment of a process of a recovery operation.

There are many ways in which the recovery operation can be performed. Process 1200 in FIG. 12 is a flowchart that shows one embodiment of steps 1108, 1110, 1114, and 1116 of process 1100. Various steps of process 1200 may by performed by the managing circuitry, such as one or more of control circuitry 110, state machine 112, decoders 114/124/132, storage 113, power control module 116, sense blocks SB1, SB2, . . . , SBp, and/or read/write circuits 128.

Steps 1202, 1204, and 1208 each test a FBC against some threshold. The FBC refers pertains to the data that was written in step 1106 of process 1100. The three thresholds are progressively larger. That is, Limit A<Limit B<Limit C. In one embodiment, the FBC is determined by performing erratic program detection. If the FBC is less than Limit A, then step 1118 is performed. This means that the programming was successful and that a recovery operation is not needed.

If the FBC is greater than or equal to Limit A, but less than Limit B (step 1204=no), then step 1206 is performed. In step 1206, the open region of the partially programmed block is filled with a dummy pattern. This can prevent problems associated with charges trapped in the tunnel dielectric from becoming worse. Recall that the memory cells in the open region of the block are in the erased state prior to step 1206. These memory cells may have some amount of charges trapped in their dielectric regions. However, the relatively low FBC may be an indicator that the number of trapped charges are not terribly severe. Rather than stressing the block with an erase operation, step 1206 takes the gentler approach of writing the dummy pattern. Note that the dummy pattern results in charges being stored in the charge storage region of the memory cells. The dummy pattern may prevent or reduce further charges from becoming trapped in the tunnel dielectrics of the memory cells.

After step 1206, the block is ready for further operations. Thus, the block is marked as ready for a new operation, in step 1207. This may include the controller 122 storing information that indicates the status of the block. The data that has already been programmed may remain in place in the partially programmed block. If it is desired to erase the data in the block and write new data therein, the block will be in good condition for such operations. The erase operation that normally occurs prior to writing new data will be able to remove most or all of the relatively small amount of charges trapped in the dielectric regions. After step 1207, the process may continue at step 1124 of process 1100. That step will select another block for programming in order to complete the original program request. Note that it is not required that a partially programmed block be selected.

Returning now to the test of step 1204, if the FBC is equal to or greater than Limit B (step 1204=yes), then step 1208 is performed. Step 1208 compares the FBC with Limit C. If the FBC is equal to or greater than Limit B, but less than Limit C, then the process 1200 goes to step 1210. Steps 1210-1414 describe another recovery option. This recovery option is somewhat more aggressive than step 1206. Step 1210 includes copying the data from the partially programmed block to some other location. One possibility is to select a completely open block to copy the data to, which in effect replaces the present partially programmed block. Another possibility is to copy the data to a partially programmed block. Still another possibility is to copy the data to some temporary location, such as RAM in the controller.

After copying the data, the partially programmed block is erased, in step 1212. The erase may be a "soft erase". Erasing the memory cells may place stress on them. The soft erase reduces the amount of stress. The soft erase may reduce the stress by not erasing the memory cells as deeply. This can be accomplished by using lower voltages, fewer erase pulses, etc. For normal erase procedures, an erase verify is performed. However, the erase verify may be skipped in step 1212.

In step 1214, a dummy pattern is written to the block. The block is then marked as ready for further operations, in step 1215. This may include the controller 122 adding the block to a list of blocks that are ready for accepting new data. For example, the block can now be erased and more data can be written to it. One possibility is to restore the data that was just moved. However, instead the block can simply be returned to a list of blocks that are entirely open. The dummy pattern may be left in the block to help prevent charges from becoming trapped in the tunnel dielectrics of the memory cells. After step 1215, process 1200 may go to step 1124 of process 1100.

Returning now to the test of step 1208, if the FBC is equal to or greater than Limit C (step 1208=yes), then step 1216 is performed. Steps 1216-1222 describe another recovery option. Note that these steps are one way to handle a still more severe trapped charge problem than steps 1210-1214. Steps 1216-1220 may be similar to steps 1216-1222. These steps copy the data from the partially programmed block to another location (step 1216), erase the block (step 1218), and write a dummy pattern to the block (step 1220). The erase may be a soft erase. A difference with this recovery process is that steps 1218-1220 may be repeated, using a different dummy pattern each time. Thus, step 1222 tests to determine whether an additional dummy pattern should be written. One possibility is for there to be a pre-determined number of dummy patterns. In other words, the erase and dummy pattern loop may be repeated a pre-determined number of time. One possibility is for the number of loops to depend on the FBC. Still another possibility is to test the efficacy of the erase by performing another FBC test to determine whether erase should be performed. After all of the erase/dummy pattern loops have been performed (step 1222=no), step 1224 is performed.

Steps 1224-1228 describes a way to determine whether the recovery process was successful. In step 1224, the process waits some period of time to allow a data retention problem to show up. This may be referred to as a "data retention time". As noted above, a reason why the memory cell may have a data retention problem is due to charges in the tunnel dielectric going back to the channel. The data retention time may be a sufficient amount of time to allow charges to leave the tunnel dielectric and create a data retention problem. Any suitable length of time may be used for the "data retention time."

In one embodiment, the data retention \time is tracked based on program/erase cycle information for blocks related to the partially programmed block. Typically, the device keeps track of the number of program/erase cycles for each block. The controller could average the program/erase cycles for all of the blocks on the same die as the partially programmed block, the same plane as the partially programmed block, the same memory device as the partially programmed block, etc. The average number of program/erase cycles could serve as a good indicator of how much time has passed.

Step 1224 step may include writing some test data to a group of memory cells, waiting, and then testing a FBC. The test data could be the last dummy pattern that was written in step 1220. If the FBC is too high (step 1226=yes), then the block is retired, in step 1228. Thus, the controller may add this block to a list of blocks that should not be used. Step 1228 compares the FBC to Limit D (or a data retention fail bit threshold). Limit D may higher, lower, or the same as the other Limits (A, B, C). If the FBC is less than limit D, then the block is added to the list of blocks that are available for a new operation. For example, the controller may add the block to a list of blocks that are completely open, in step 1227. Whether the partially programmed block is successfully recovered or not, the process may continue with step 1124.

Note that another option if the FBC is greater than Limit D in step 1226 is to return to step 1218 to erase the block again. This could be repeated one more times, before determining that the block should be retired (in step 1228).

There are many other ways to perform the recovery operation. Process 1200 could be modified by skipping some of the steps. For example, process 1200 might be modified by dropping steps 1204 and 1206, which in effect drops the recovery option of filling the block with the dummy pattern. Another example is to drop steps 1208-1414. Other modifications are possible.

Figure 13:
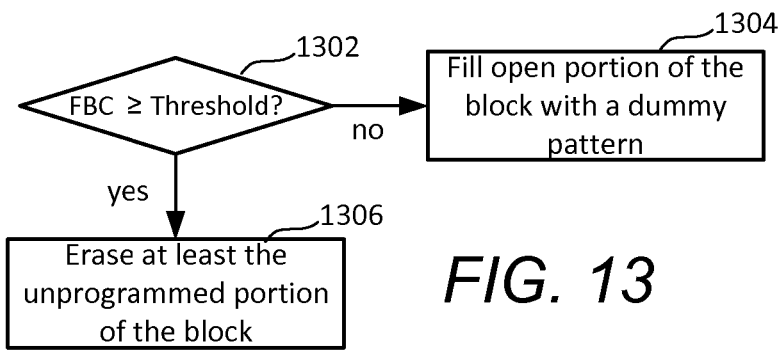
FIGS. 13 are 14 are flowchart of different embodiments of recovery operations for a partially programmed block.

FIG. 13 is a flowchart of one embodiment of a process 1300 of a recovery operation. Process 1300 can be used in step 1110 of process 1100. Step 1302 is a comparison of the FBC to some threshold. The FBC refers to the one from programming the memory cells in step 1106. If the FBC is less than the threshold, then the open region of the block is filled with a dummy pattern, in step 1304. Step 1304 is similar to step 1206.

If the FBC is equal to or greater than the threshold, then at least the unprogrammed region of the block is erased, in step 1306. One example of erasing at least the unprogrammed region of the block was described with respect to steps 1210-1214. Another example was described with respect to steps 1216-1222.

Still another possibility is to perform a partial block erase in step 1306. Note that when performing a partial block erase, the already programmed data may remain in place. Step 1306 performs a partial block erase in a 3D non-volatile memory, in one embodiment. One approach to erasing in a 3D non-volatile memory is to generate gate induced drain leakage (GIDL) to charge up the NAND string channel, raise the channel potential to an erase voltage, and maintain this channel potential during erase. In one example, the memory device includes NAND strings that have a drain-side select gate SGD transistor and a source-side select gate SGS transistor. The erase may be a one-sided erase or a two-sided erase. When a voltage (e.g., erase voltage) is applied to the bit line in a one-sided erase, the select gate transistors generate a sufficient amount of gate-induced drain leakage (GIDL) current to charge up the floating body (channel) of the NAND string. A voltage can be applied to the bit line and the source line in a two-sided erase to generate gate-induced drain leakage at the drain-side select gate. GIDL increases in proportion to the drain-to-gate voltage (Vdg) of the select gate transistors.

Figure 14:
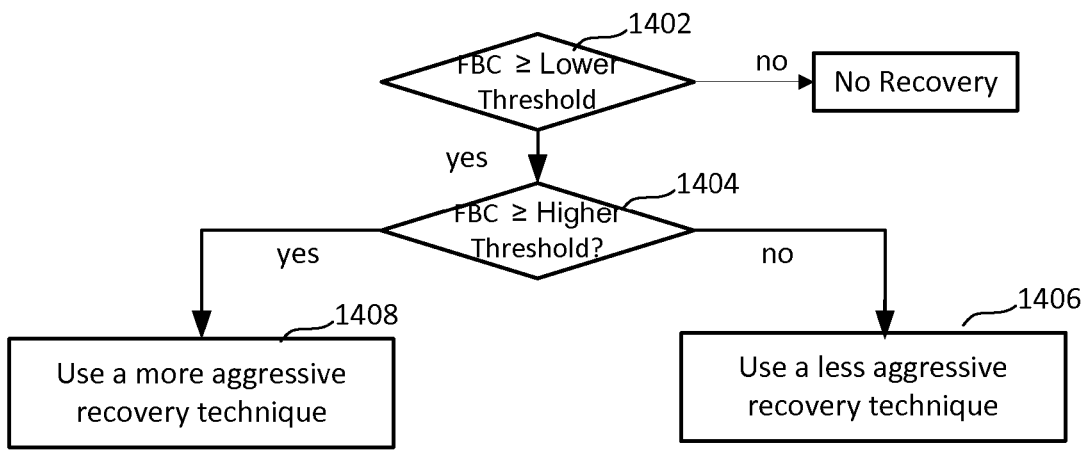

FIG. 14 is a flowchart of one embodiment of a process of a recovery operation. Process 1400 can be used in step 1110 of process 1100. Step 1402 is a comparison of the FBC to a lower threshold. The FBC refers to the one from programming the memory cells in step 1106. If the FBC is less than the lower threshold, then no recovery of the partially programmed block is performed. If the FBC is above the lower threshold, the FBC is compared to a higher threshold in step 1404. If the FBC is above the lower threshold, but less than the higher threshold, then a less aggressive recovery process is performed, in step 1406. If the FBC is equal to or greater than the higher threshold, then a more aggressive recovery process is performed, in step 1408.

An example of the less aggressive recovery process is steps 1210-1214 of process 1200 in which a single erase operation is performed. An example of the more aggressive recovery process is steps 1216-1222 of process 1200 in which a multiple erase operations are performed. The more aggressive recovery process may be more suitable when the charge trapping process is more severe. However, the more aggressive recovery process may create more stress and may increase write amplification. Conversely, the less aggressive recovery process may be more suitable when the charge trapping process is less severe. The less aggressive recovery process may result is less stress and may reduce write amplification.

Process 1200 contains other examples of recovery processes in which one is less aggressive than the other. For example, step 1206 may be considered to be less aggressive than steps 1210-1214. Similarly, step 1206 may be considered to be less aggressive than steps 1216-1222.

Figure 15:
FIG. 15 depicts a flowchart of an example erase process that may be used in a recovery operations for a partially programmed block.

FIG. 15 depicts a flowchart of an example erase process that may be used during a partial block recovery operation. This erase process may be used for 3D NAND. This process may be used for a partial block erase. Note that this process provides for a gentle or "soft" erase procedure. Note that this is just one example of an erase process; there are many ways to erase 3D NAND.

In this process, subsets of memory cells can be independently inhibited from being further erased in a remainder of an erase operation, once the subsets reach a verify condition. As a result, problems relating to over-erase can be reduced or avoided. Once a subset of memory cells meets a verify condition, the memory cells will not see the subsequent erase signals. This approach can tighten erase distributions, avoid over-stressing the verified memory cells, prevent deep-erased memory cells and minimize a transverse field.

Step 1500 begins the erase operation for a set of cells comprising one type of subset. The set may be a block of cells, for instance. The set could be a portion of the block of cells, such as the open word lines. Status data can be maintained for each subset indicating whether the subset has a status of "inhibited," which indicates that the subset is to be inhibited from further erasing in the erase portion of a successive erase iteration of the erase operation, or a status of "uninhibited," which indicates that the subset is not to be inhibited from further erasing in the erase portion of a successive erase iteration of the erase operation (that is, the subset is to continue to undergo erasing). The status data can be maintained by the on-chip control circuitry 110 or the off-chip controller 122, for instance, and updated based on results of a verify test of each erase iteration.

Step 1502 initializes Verase, the peak voltage which is applied to a bit line in a one-sided erase operation, or to both a bit line and a source line in a two-sided erase operation.

Step 1504 performs an erase iteration for the subsets with status=uninhibited. These subsets undergo erasing. Step 1506 performs a verify test for the subsets with status=uninhibited. The verify test indicates which memory cells have a Vth below a verify voltage, Vv-erase. A memory cell is considered to pass the verify test when its Vth is below Vv-erase, and a memory cell is considered to fail the verify test when its Vth is not below Vv-erase. A fail bit count can be provided which indicates a number of memory cells in a subset which fail the verify test. Or, a pass bit count can be provided which indicates a number of memory cells in a subset which pass the verify test.

Decision step 1508 determines if a verify condition is met for the set of memory cells. For example, a verify condition may be met when there are ≤N1 fail bits, where N1 is a natural number. For example, N1 may be 1-10% of the total number of memory cells in the set. If decision step 1508 is true, the operation ends successfully at step 1520. If decision step 1508 is false, decision step 1510 determines if Verase=Verase_max, where Verase_max is a maximum allowable voltage. To avoid damage, this voltage is limited to a maximum. If decision step 1510 is true, the erase operation ends unsuccessfully at step 1520. If decision step 1510 is false, decision step 1512 determines if any cells (in the subsets having a status=uninhibited) pass the verify test.

If decision step 1512 is false, then Verase is stepped up at step 1522 and a next erase iteration is performed at step 1504.

If decision step 1512 is true, step 1514 considers the result of the verify test for a subset. The result can indicate the number of fail bits in the subset, for instance. At step 1516, if the subset meets a respective verify condition (e.g., a first verify condition), the status of the subset is set to inhibited. As a result, the subset of memory cells (e.g., a first subset) will be inhibited from being erased in a remainder of the erase operation, e.g., in an erase portion of a subsequent erase iteration of the erase operation. If the subset does not meet the respective verify condition, the status of the subset remains as uninhibited. The respective verify condition may be met, e.g., when the number of fail bits in the subset is less than a maximum allowable number.

If there is a next subset to consider at decision step 1518, step 1514 is repeated for the next subset. If decision step 1518 is false, step 1522, discussed previously, is reached.

One embodiment disclosed herein includes a non-volatile storage device, comprising a plurality of blocks that comprise non-volatile storage elements, and managing circuitry in communication with the non-volatile storage elements. The managing circuitry is configured to program a set of non-volatile storage elements in a block that comprises programmed non-volatile storage elements and unprogrammed non-volatile storage elements. The managing circuitry is configured to determine a fail bit count of programming the set of non-volatile storage elements. The managing circuitry is configured to perform a recovery operation that involves unprogrammed non-volatile storage elements in the block other than those in the set in response to determining that the fail bit count exceeds a threshold.

One embodiment disclosed herein includes a method comprising receiving a programming request; programming a first unprogrammed word line in a partially programmed block in response to the programming request, wherein the partially programmed block has a programmed region with one or more word lines programmed and an unprogrammed region with one or more word lines unprogrammed; determining a fail bit count of programming the first unprogrammed word line; and performing a recovery operation with respect to a second unprogrammed word line in the partially programmed block in response to determining that the fail bit count exceeds a threshold.

One embodiment disclosed herein a non-volatile storage device, comprising a plurality of word lines, a plurality of NAND strings of non-volatile storage elements arranged in blocks, wherein each of the NAND strings is associated with the plurality of word lines, and managing circuitry in communication with the plurality of word lines and with the plurality of NAND strings. The managing circuitry selects a partially programmed block of the non-volatile storage elements to program. The partially programmed block comprises programmed word lines and unprogrammed word lines. The managing circuitry programs non-volatile storage elements associated with a first unprogrammed word line in the partially programmed block. The managing circuitry determines a fail bit count of programming the first unprogrammed word line. The managing circuitry performs an erase operation of the unprogrammed word lines in the partially programmed block in response to the fail bit count being greater than a threshold.

One embodiment disclosed herein include a three-dimensional non-volatile storage device comprising a three-dimensional memory array and managing circuitry. The three-dimensional memory array comprises a plurality of word lines and a plurality of non-volatile storage elements arranged in blocks. The managing circuitry is in communication with the plurality of word lines and with the plurality of non-volatile storage elements. The managing circuitry receives a request to program data into the three-dimensional memory array. The managing circuitry selects a partially programmed block of the non-volatile storage elements to program the data into. The partially programmed block comprises programmed word lines and unprogrammed word lines. The managing circuitry programs the data into non-volatile storage elements associated with a first unprogrammed word line in the partially programmed block. The managing circuitry determines a fail bit count of programming the first unprogrammed word line. The managing circuitry performs a recovery operation that involves a second unprogrammed word line in the partially programmed block in response to determining that the fail bit count exceeds a threshold.

The foregoing detailed description has been presented for purposes of illustration and description. It is not intended to be exhaustive or to limit the subject matter claimed herein to the precise form(s) disclosed. Many modifications and variations are possible in light of the above teachings. The described embodiments were chosen in order to best explain the principles of the disclosed technology and its practical application to thereby enable others skilled in the art to best utilize the technology in various embodiments and with various modifications as are suited to the particular use contemplated. It is intended that the scope of the invention be defined by the claims appended hereto.

What is claimed is:

1. A non-volatile storage device, comprising:
   a plurality of blocks that comprise non-volatile storage elements; and
   managing circuitry in communication with the non-volatile storage elements; the managing circuitry configured to program a set of non-volatile storage elements in a block that comprises programmed non-volatile storage elements and unprogrammed non-volatile storage elements; the managing circuitry configured to determine a fail bit count of programming the set of non-volatile storage elements; the managing circuitry configured to perform a recovery operation that involves unprogrammed non-volatile storage elements in the block other than those in the set, in response to determining that the fail bit count exceeds a first threshold, to perform the recovery operation the managing circuitry configured to program one or more of the unprogrammed non-volatile storage elements in the block with dummy data when the fail bit count is less than a second threshold.

2. The non-volatile storage device of claim 1, wherein to perform the recovery operation the managing circuitry is further configured to save data from the programmed non-volatile storage elements in the block to another location, and erase the programmed and the unprogrammed non-volatile storage elements in the block when the fail bit count is greater than the second threshold.

3. The non-volatile storage device of claim 2, wherein to perform the recovery operation the managing circuitry is further configured to write a dummy pattern to the programmed and the unprogrammed non-volatile storage elements in the block after erasing the block.

4. The non-volatile storage device of claim 1, wherein to perform the recovery operation the managing circuitry is further configured to:

erase the block multiple times and write a different dummy pattern to the block after each erase when the fail bit count is greater than a third threshold that is higher than the second threshold.

5. The non-volatile storage device of claim 4, wherein the managing circuitry is further configured to:
    wait a data retention time after writing a last of the dummy patterns to the block;
    determine a fail bit count with respect to writing the last dummy pattern to the block after waiting the data retention time; and
    retire the block in response to the fail bit count with respect to writing the last dummy pattern being greater than a data retention fail bit threshold.

6. The non-volatile storage device of claim 1, wherein to perform the recovery operation the managing circuitry is configured to apply an erase operation to the unprogrammed non-volatile storage elements in the block while leaving programmed non-volatile storage elements in the block programmed when the fail bit count is greater than the second threshold.

7. The non-volatile storage device of claim 1, further comprising a three-dimensional memory array, wherein the non-volatile storage elements reside within the three-dimensional memory array.

8. The non-volatile storage device of claim 1, further comprising:
    a plurality of word lines, wherein each of the non-volatile storage elements is associated with a word line of the plurality of word lines, wherein to program the set of the non-volatile storage elements in the block the managing circuitry is configured to program non-volatile storage elements associated with a first word line of the plurality of word lines, wherein to perform the recovery operation the managing circuitry is configured to perform an erase operation for non-volatile storage elements associated with a second word line for which the non-volatile storage elements are already erased when the fail bit count is greater than the second threshold.

9. A method, comprising:
    receiving a programming request;
    programming a selected unprogrammed word line in a partially programmed block in response to the programming request, wherein the partially programmed block has a programmed region with one or more word lines programmed and an unprogrammed region with the selected unprogrammed word line and one or more other unprogrammed word lines;
    determining a fail bit count of programming the selected first unprogrammed word line; and
    performing a recovery operation with respect to the unprogrammed region in the partially programmed block, in response to determining that the fail bit count exceeds a threshold, comprising performing an erase operation of at least the one or more other unprogrammed word lines in the unprogrammed region.

10. The method of claim 9, wherein performing the recovery operation further comprises:
    saving data from the programmed region of the partially programmed block to another location;
    erasing the partially programmed block;
    writing a dummy pattern to the partially programmed block after erasing the partially programmed block; and
    marking the partially programmed block as an open block after writing the dummy pattern.

11. The method of claim 9, wherein the threshold is a first threshold, wherein performing the recovery operation comprises:
    performing a less aggressive erase if the fail bit count is greater than or equal to the first threshold but less than a second threshold; and
    performing a more aggressive erase if the fail bit count is greater than or equal to the second threshold.

12. The method of claim 11, wherein the less aggressive erase comprises erasing the partially programmed block a single time, wherein the more aggressive erase comprises erasing the partially programmed block multiple times.

13. The method of claim 9, further comprising:
    waiting a data retention time after writing a dummy pattern to the partially programmed block;
    determining a fail bit count with respect to writing the last dummy pattern to the partially programmed block after waiting the data retention time;
    retiring the partially programmed block in response to the fail bit count with respect to writing the dummy pattern being greater than or equal to a data retention fail bit threshold; and
    marking the partially programmed block as ready for a new operation in response to the fail bit count with respect to writing the dummy pattern being less than the data retention fail bit threshold.

14. The method of claim 9, wherein performing the recovery operation comprises:
    erasing the partially programmed block;
    writing a dummy pattern to the partially programmed block;
    waiting a data retention time after writing the dummy pattern to the partially programmed block;
    determining a fail bit count with respect to writing the dummy pattern to the partially programmed block after waiting the data retention time; and
    erasing the partially programmed block again in response to the fail bit count with respect to writing the dummy pattern being greater than or equal to a data retention fail bit threshold.

15. The method of claim 9, wherein performing the recovering operation comprises:
    erasing only the one or more other unprogrammed word lines in the unprogrammed region of the partially programmed block.

16. A non-volatile storage device, comprising:
    a plurality of word lines;
    a plurality of NAND strings of non-volatile storage elements arranged in blocks, wherein each of the NAND strings is associated with the plurality of word lines; and
    managing circuitry in communication with the plurality of word lines and with the plurality of NAND strings, wherein the managing circuitry selects a partially programmed block of the non-volatile storage elements to program, wherein the partially programmed block comprises programmed word lines and unprogrammed word lines; wherein the managing circuitry programs non-volatile storage elements associated with a first unprogrammed word line in the partially programmed block; wherein the managing circuitry determines a fail bit count of programming the first unprogrammed word line; wherein the managing circuitry performs an erase operation of the unprogrammed word lines in the partially programmed block, in response to the fail bit count being greater than a threshold.

17. The non-volatile storage device of claim 16, wherein the threshold is a first threshold that is lower than a second threshold, wherein:

in response to the fail bit count being greater than or equal to the first threshold but less than the second threshold, the managing circuitry performs a single erase operation of the non-volatile storage elements associated with the unprogrammed word lines, and writes a dummy pattern to the non-volatile storage elements associated with the unprogrammed word lines after the single erase operation;

in response to the fail bit count being greater than or equal to the second threshold, the managing circuitry performs multiple erase operations of the non-volatile storage elements associated with the unprogrammed word lines, and writes a different dummy pattern to the non-volatile storage elements associated with the unprogrammed word lines after each of the multiple erase operations.

18. The non-volatile storage device of claim 16, wherein the managing circuitry:

writes a pattern to the unprogrammed word lines after the managing circuitry erases the unprogrammed word lines;

determines a fail bit count with respect to writing the pattern after waiting a pre-determined amount of time;

retires the partially programmed block in response to the fail bit count with respect to writing the pattern being greater than a data retention fail bit threshold; and marks the partially programmed block as an open block in response to the fail bit count with respect to writing the pattern being less than the data retention fail bit threshold.

19. A three-dimensional non-volatile storage device, comprising:

a three-dimensional memory array that comprises a plurality of word lines and a plurality of non-volatile storage elements arranged in blocks; and managing circuitry in communication with the plurality of word lines and with the plurality of non-volatile storage elements, the managing circuitry receives a request to program data into the three-dimensional memory array, the managing circuitry selects a partially programmed block of the non-volatile storage elements to program the data into, wherein the partially programmed block comprises programmed word lines and unprogrammed word lines, the managing circuitry programs the data into non-volatile storage elements associated with a first unprogrammed word line in the partially programmed block, the managing circuitry determines a fail bit count of programming the first unprogrammed word line, the managing circuitry performs a recovery operation that involves a second unprogrammed word line in the partially programmed block, in response to determining that the fail bit count exceeds a threshold, the recovery operation comprising performing an erase operation of the second unprogrammed word line.

20. A method, comprising:

receiving a programming request;

programming a selected unprogrammed word line in a partially programmed block in response to the programming request, wherein the partially programmed block has a programmed region with one or more word lines programmed and an unprogrammed region with the selected word line and one or more other unprogrammed word lines;

determining a fail bit count of programming the selected unprogrammed line; and performing a recovery operation with respect to the one or more other unprogrammed word lines in the partially programmed block in response to determining that the fail bit count exceeds a first threshold, the recovery operation comprising programming at least one of the one or more other unprogrammed word lines in the block with dummy data when the fail bit count is less than a second threshold.

\* \* \* \* \*

UNITED STATES PATENT AND TRADEMARK OFFICE
CERTIFICATE OF CORRECTION

PATENT NO.       : 9,460,799 B1
APPLICATION NO.  : 14/951347
DATED            : October 4, 2016
INVENTOR(S)      : Costa et al.

It is certified that error appears in the above-identified patent and that said Letters Patent is hereby corrected as shown below:

In the Claims

Column 27, Lines 51-52, Claim 9: After "selected" and before "unprogrammed" delete "first".

Signed and Sealed this
Fourteenth Day of March, 2017

Michelle K. Lee
*Director of the United States Patent and Trademark Office*